(12) United States Patent
Sohn et al.

(10) Patent No.: US 9,892,980 B2
(45) Date of Patent: Feb. 13, 2018

(54) FAN-OUT PANEL LEVEL PACKAGE AND METHOD OF FABRICATING THE SAME

(71) Applicant: Samsung Electronics Co., Ltd., Suwon-si, Gyeonggi-do (KR)

(72) Inventors: Younghoon Sohn, Incheon (KR); Jinsung Kim, Suwon-si (KR); Yusin Yang, Seoul (KR); Chungsam Jun, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/437,566

(22) Filed: Feb. 21, 2017

(65) Prior Publication Data

US 2017/0309523 A1    Oct. 26, 2017

(30) Foreign Application Priority Data

Apr. 26, 2016    (KR) .................. 10-2016-0050998

(51) Int. Cl.
*H01L 21/66*    (2006.01)
*H01L 21/768*   (2006.01)
(Continued)

(52) U.S. Cl.
CPC .......... *H01L 22/12* (2013.01); *H01L 21/0274* (2013.01); *H01L 21/31144* (2013.01); *H01L 21/4846* (2013.01); *H01L 21/565* (2013.01); *H01L 21/67259* (2013.01); *H01L 21/6835* (2013.01); *H01L 21/76802* (2013.01); *H01L 21/76895* (2013.01); *H01L 24/06* (2013.01); *H01L 24/11* (2013.01);
(Continued)

(58) Field of Classification Search
CPC ....... H01L 22/12; H01L 21/02; H01L 21/027; H01L 21/0271–21/0274; H01L 21/31144; H01L 2224/25171; H01L 2224/02379; H01L 2224/41171–2224/41173; H01L 2224/49171–2224/49173
See application file for complete search history.

(56) References Cited

U.S. PATENT DOCUMENTS 6,262,478 B1 * 7/2001 Hurwitz ............ H01L 21/76885
257/700
8,259,295 B2    9/2012 Watanabe
(Continued)

FOREIGN PATENT DOCUMENTS

| KR | 10-2007-0018524 | 2/2007 |
|----|-----------------|--------|
| KR | 10-1032721 B1   | 5/2011 |
| KR | 10-1273094 B1   | 6/2013 |
| KR | 10-1454666 B1   | 10/2014 |

*Primary Examiner* — Syed Gheyas
(74) *Attorney, Agent, or Firm* — Harness, Dickey & Pierce, P.L.C.

(57) ABSTRACT

A method of fabricating a package includes providing a mold substrate supporting dies in cavities of a fan-out substrate, detecting positions of the dies with respect to the fan-out substrate, and forming interconnection lines. At least one of the interconnection lines includes a first portion extending from the fan-out substrate to a target position on the cavity disposed between the fan-out substrate and one of the dies the one of the dies disposed at a detected position different from the target position, and a second portion extending from the one die to the fan-out substrate.

16 Claims, 32 Drawing Sheets

(51) Int. Cl.
*H01L 21/027* (2006.01)
*H01L 21/311* (2006.01)
*H01L 23/00* (2006.01)
*H01L 21/48* (2006.01)
*H01L 21/683* (2006.01)
*H01L 21/56* (2006.01)
*H01L 21/67* (2006.01)
*H01L 21/02* (2006.01)

(52) U.S. Cl.
CPC .... *H01L 21/0217* (2013.01); *H01L 21/02164* (2013.01); *H01L 21/02271* (2013.01); *H01L 2221/68345* (2013.01); *H01L 2224/02311* (2013.01); *H01L 2224/13024* (2013.01); *H01L 2224/14131* (2013.01); *H01L 2924/1433* (2013.01); *H01L 2924/1434* (2013.01); *H01L 2924/152* (2013.01); *H01L 2924/15153* (2013.01); *H01L 2924/15747* (2013.01)

(56) References Cited

U.S. PATENT DOCUMENTS

| | | | |
|---|---|---|---|
| 8,597,979 | B1 | 12/2013 | Burgyan |
| 8,799,845 | B2* | 8/2014 | Scanlan ................ H01L 22/12 716/110 |
| 2003/0001117 | A1 | 1/2003 | Hyun |
| 2004/0049912 | A1* | 3/2004 | Akagawa ............ H01L 23/5389 29/846 |
| 2007/0249067 | A1* | 10/2007 | Hedler ................ H01L 23/5389 438/4 |
| 2011/0038704 | A1* | 2/2011 | Hawryluk ............ G03F 9/7003 414/800 |
| 2011/0156239 | A1 | 6/2011 | Jin |
| 2013/0292846 | A1* | 11/2013 | Lee ...................... H01L 23/538 257/774 |
| 2014/0198185 | A1 | 7/2014 | Haugen et al. |
| 2015/0359098 | A1* | 12/2015 | Ock ........................ H01L 25/16 361/782 |

* cited by examiner

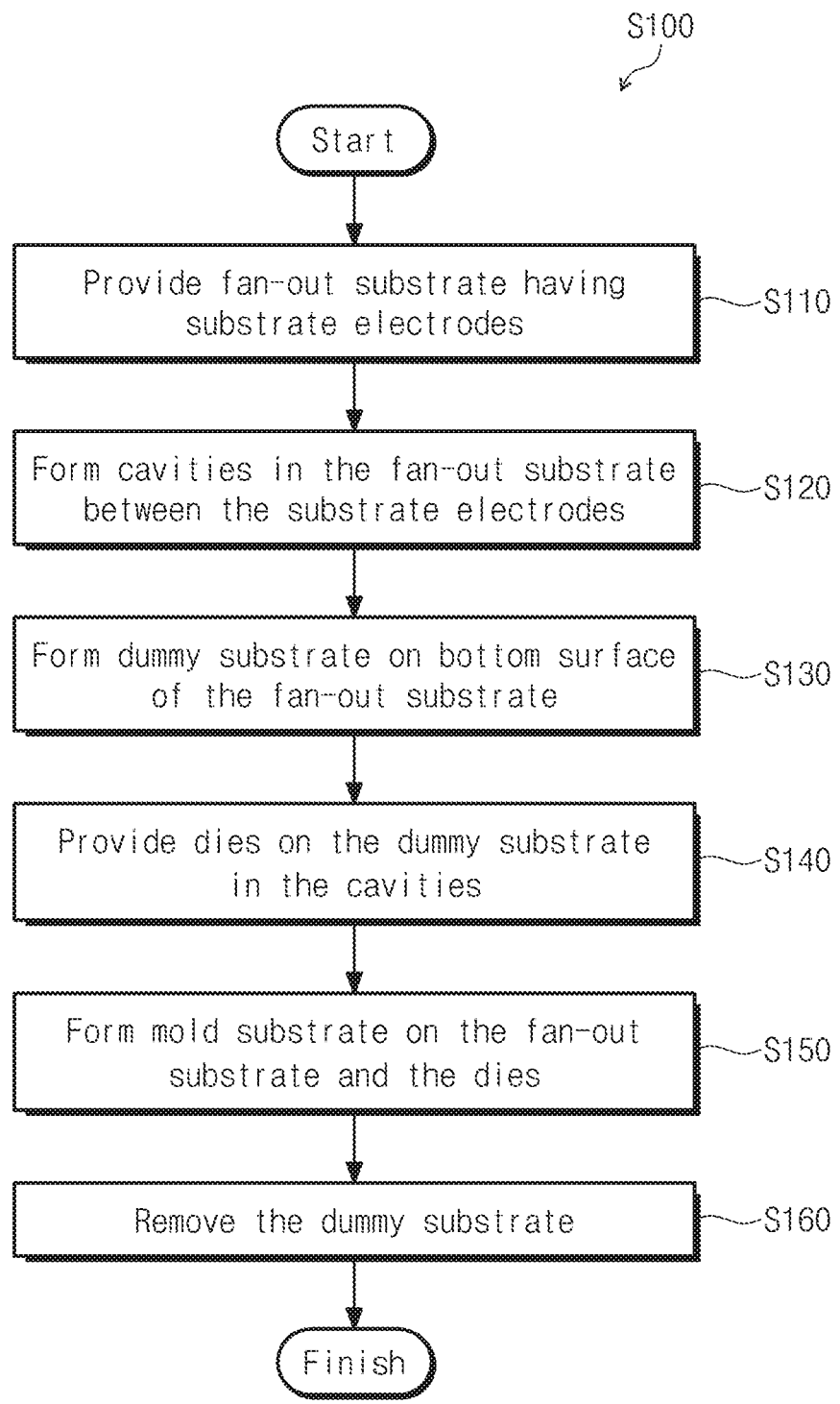

FAN-OUT PANEL LEVEL PACKAGE AND METHOD OF FABRICATING THE SAME

CROSS-REFERENCE TO RELATED APPLICATION

This U.S. non-provisional patent application claims priority under 35 U.S.C. § 119 to Korean Patent Application No. 10-2016-0050998, filed on Apr. 26, 2016, in the Korean Intellectual Property Office, the disclosure of which is hereby incorporated by reference in its entirety.

BACKGROUND

Embodiments of the inventive concepts relate to a package and/or a method of fabricating the same and, more particularly, to a fan-out panel level package and/or a method of fabricating the same.

As semiconductor chips have been highly integrated, sizes of the semiconductor chips have been reduced. However, distances between solder balls on the semiconductor chips are set by international standards of an international standards association such as joint electron device engineering council (JEDEC). Thus, it may be difficult to adjust the numbers of the solder balls of the semiconductor chips. In addition, as the sizes of the semiconductor chips have been reduced, handling and tests of the semiconductor chips have been difficult. Furthermore, a hoard on which a semiconductor chip is mounted should be diversified according to a size of the semiconductor chip. To solve this, a fan-out panel level package has been developed.

SUMMARY

Some embodiments of the inventive concepts may provide a fan-out panel level package capable of reducing, minimizing or preventing an interconnection failure caused by misalignment between a fan-out substrate and a die and/or a method of fabricating the same.

In an example embodiment, a method of fabricating a package may include providing a mold substrate supporting dies in cavities of a fan-out substrate, obtaining an image of the fan-out substrate and the dies to detect positions of the dies with respect to the fan-out substrate in the image, and forming interconnection lines. At least one of the interconnection lines may include a first portion extending from the fan-out substrate to a target position on the cavity disposed between the fan-out substrate and one of the dies, the one of the dies disposed at the detected position different from the target position, and a second portion extending from the one of the dies to the fan-out substrate.

In an example embodiment, a package may include a mold substrate, a fan-out substrate disposed on the mold substrate and having a cavity, a die disposed on the mold substrate in the cavity, and interconnection lines disposed on the cavity between the fan-out substrate and the die and connecting the die to the fan-out substrate. Each of the interconnection lines may include a first portion extending from the fan-out substrate to the die in a first direction, and a second portion connected to the first portion and extending from the die to the fan-out substrate in a second direction different from the first direction.

In an example embodiment, A method for forming interconnection lines for a package by detecting if a selected die is disposed within an alignment tolerance of a target position, forming first contact holes by removing portions of an interlayer insulating layer disposed on substrate electrodes of the fan-out substrate and pad electrodes of the selected die disposed at the detected position, if the selected die is disposed within the alignment tolerance, and forming the interconnection lines by a patterning process, the interconnection lines connecting one or some of substrate electrodes to one or some of pad electrodes of the selected die.

BRIEF DESCRIPTION OF THE DRAWINGS

The foregoing and other features of inventive concepts will be apparent from the more particular description of non-limiting embodiments of inventive concepts, as illustrated in the following drawings:

FIG. 2 is a flow chart illustrating an embodiment of an operation of providing a mold substrate in FIG. 1.

FIGS. 3A to 8A are plan views illustrating an embodiment of the operation of providing the mold substrate in FIG. 1.

FIGS. 3B to 8B are cross-sectional views taken along lines I-I' of FIGS. 3A to 8A, respectively.

FIGS. 14A to 19A are plan views illustrating an embodiment of the operation of forming the first contact holes in FIG. 12.

FIGS. 14B to 19B are cross-sectional views taken along lines I-I' of FIGS. 14A to 19A, respectively.

FIGS. 22A to 28A are plan views illustrating an embodiment of the operation of forming the interconnection lines by the patterning process in FIG. 12.

FIGS. 22B to 28B are cross-sectional views taken along lines I-I' of FIGS. 22A to 28A, respectively.

DETAILED DESCRIPTION OF THE EMBODIMENTS

Figure 1:
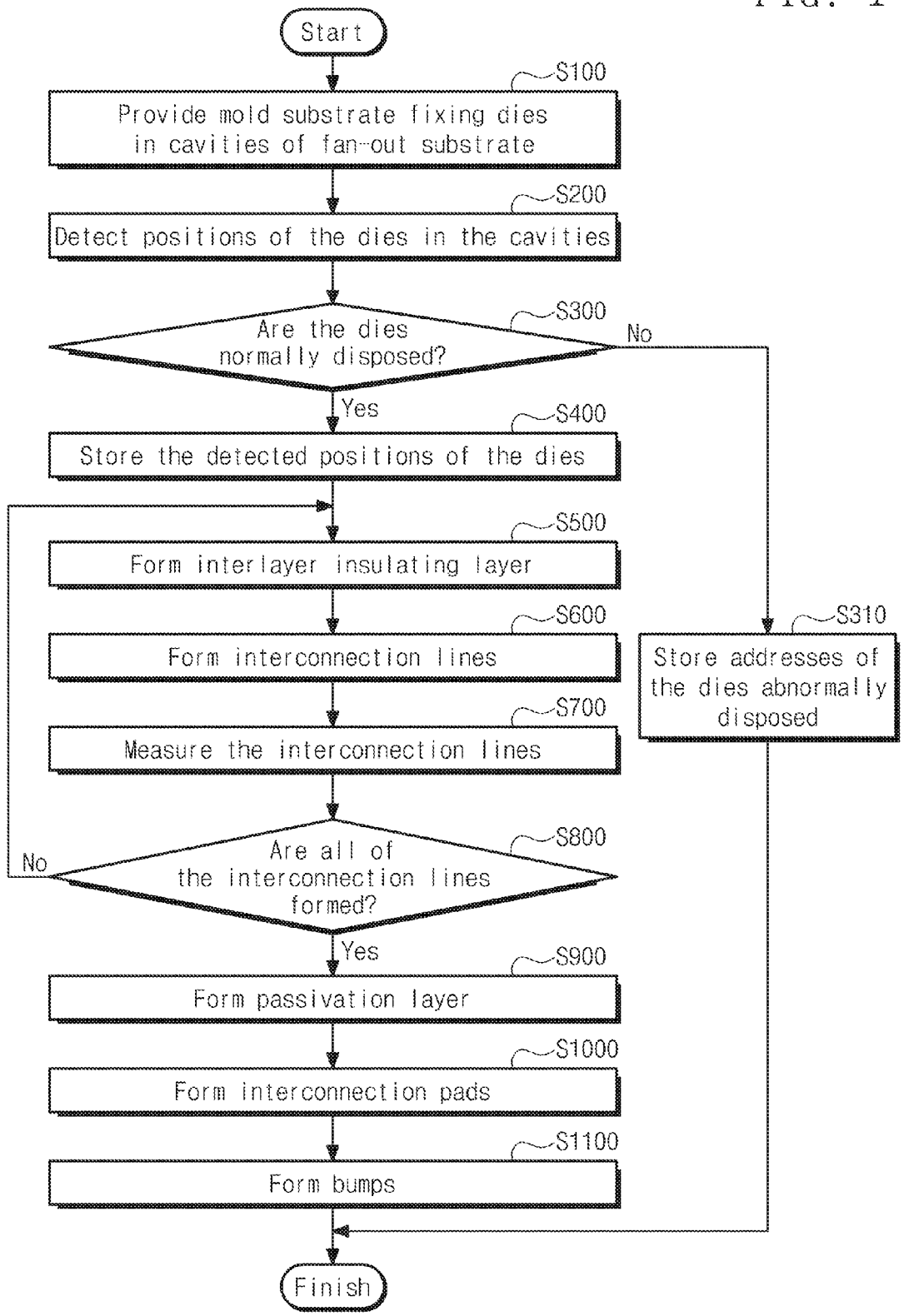
FIG. 1 is a flow chart illustrating a method of fabricating a package, according to some embodiments of the inventive concepts.

FIG. 1 illustrates a method of fabricating a package, according to some embodiments of the inventive concepts.

Referring to FIG. 1, the method of fabricating the package may include providing a mold substrate (S100), detecting positions of dies in cavities (S200), checking whether the dies are normally disposed (S300), storing addresses of the dies (S310), storing the detected position of each of the dies (S400), forming an interlayer insulating layer (S500), forming interconnection lines (S600), measuring the interconnection lines (S700), checking whether all of the interconnection lines are formed (S800), forming a passivation layer (S900), forming interconnection pads (S1000), and forming bumps (S1100).

FIG. 2 illustrates an embodiment of the operation S100 of providing the mold substrate 14 in FIG. 1. FIGS. 3A to 8A are plan views illustrating an embodiment of the operation S100 of providing the mold substrate 14 in FIG. 1. FIGS. 3B to 8B are cross-sectional views taken along lines I-I' of FIGS. 3A to 8A, respectively.

Referring to FIGS. 2, 3A to 8A, and 313 to 813, the operation S100 of providing the mold substrate 14 may include providing a fan-out substrate 2 (S11.0), forming cavities 6 (S120), forming a dummy substrate 8 (S130), providing dies 10 (S140), forming the mold substrate 14 (S150), and removing the dummy substrate 8 (S160).

Figure 3A:
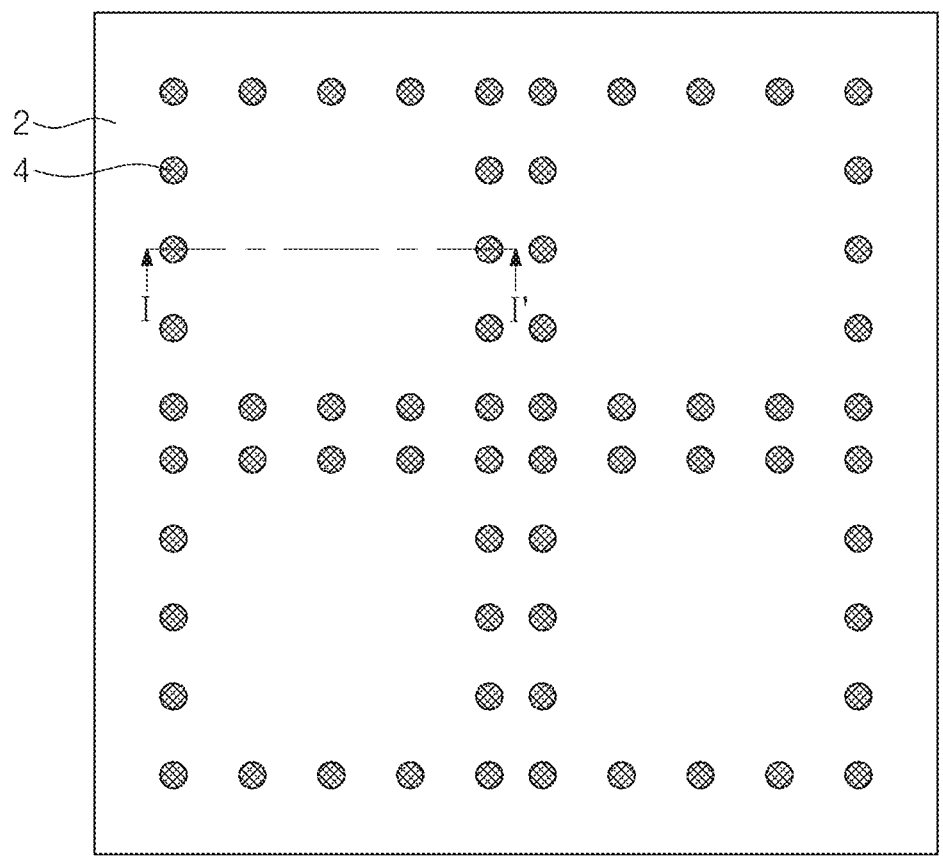
Figure 3B:
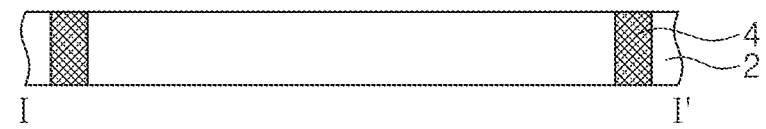

Referring to FIGS. 2, 3A and 3B, firstly, the fan-out substrate 2 in which substrate electrodes 4 are formed may be provided (S110). In some embodiments, the fan-out substrate 2 may be a copper clad laminate (CCL) substrate having the substrate electrodes 4. For example, the substrate electrodes 4 may include through-electrodes disposed in the fan-out substrate 2. The substrate electrodes 4 may be arranged along a quadrilateral ring shape in the fan-out substrate 2 when viewed from a plan view. The substrate electrodes 4 may include copper formed by an electroplating method.

Figure 4A:
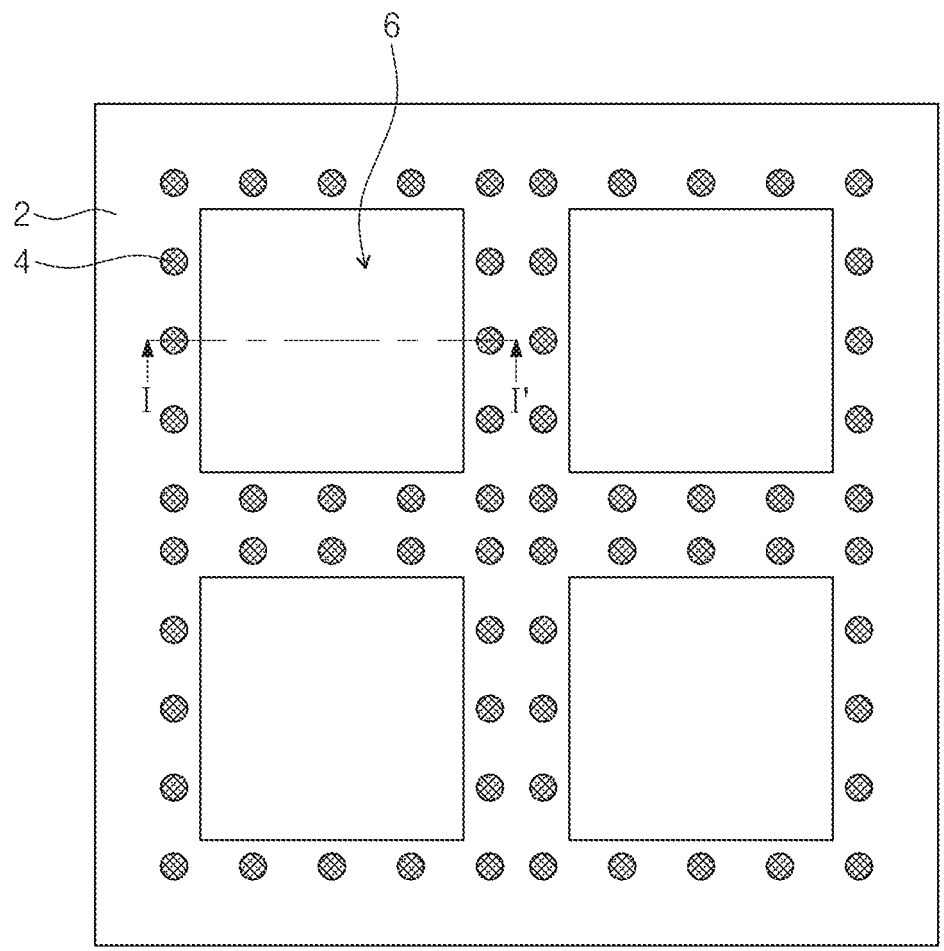
Figure 4B:
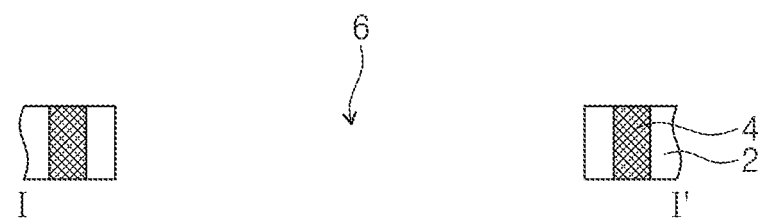

Referring to FIGS. 2, 4A, and 4B, cavities 6 may be formed in the fan-out substrate 2 (S120). For example, each of the cavities 6 may have a square shape. The cavities 6 may be formed by a printing method or a punching method. The substrate electrodes 4 may be disposed around each of the cavities 6.

Figure 5A:
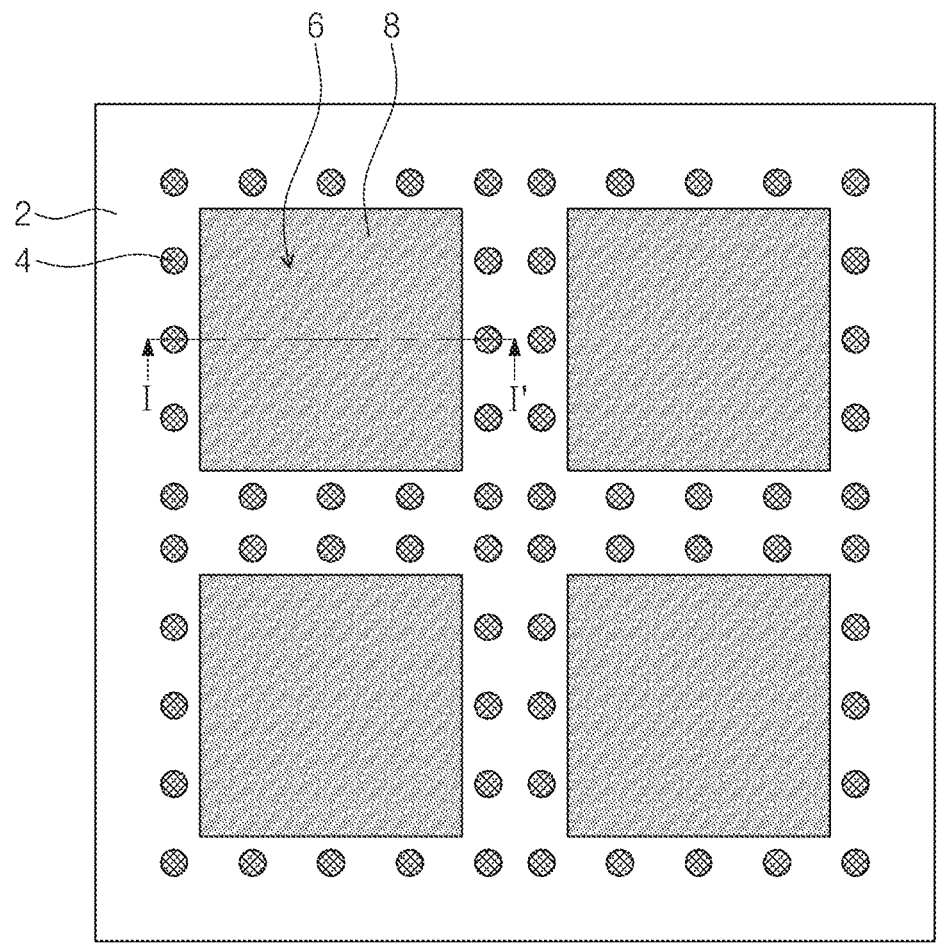
Figure 5B:
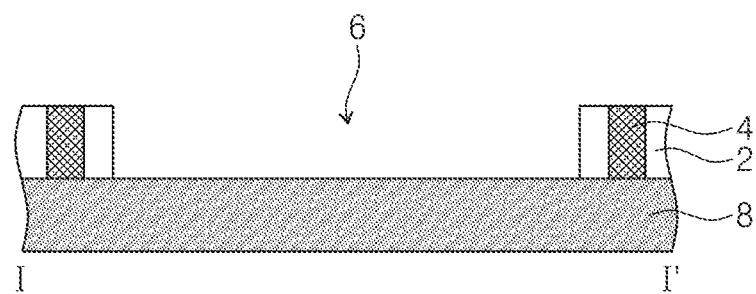

Referring to FIGS. 2, 5A, and 5B, the dummy substrate 8 may be formed under the fan-out substrate 2 (S130). In other words, the dummy substrate 8 may be formed on a bottom surface of the fan-out substrate 2 (S130). For example, the dummy substrate 8 may include an adhesive tape film. The dummy substrate 8 may adhere to the bottom surface of the fan-out substrate 2. The dummy substrate 8 may block the cavities 6. In other words, the dummy substrate 8 may close bottom ends of the cavities 6.

Figure 6A:
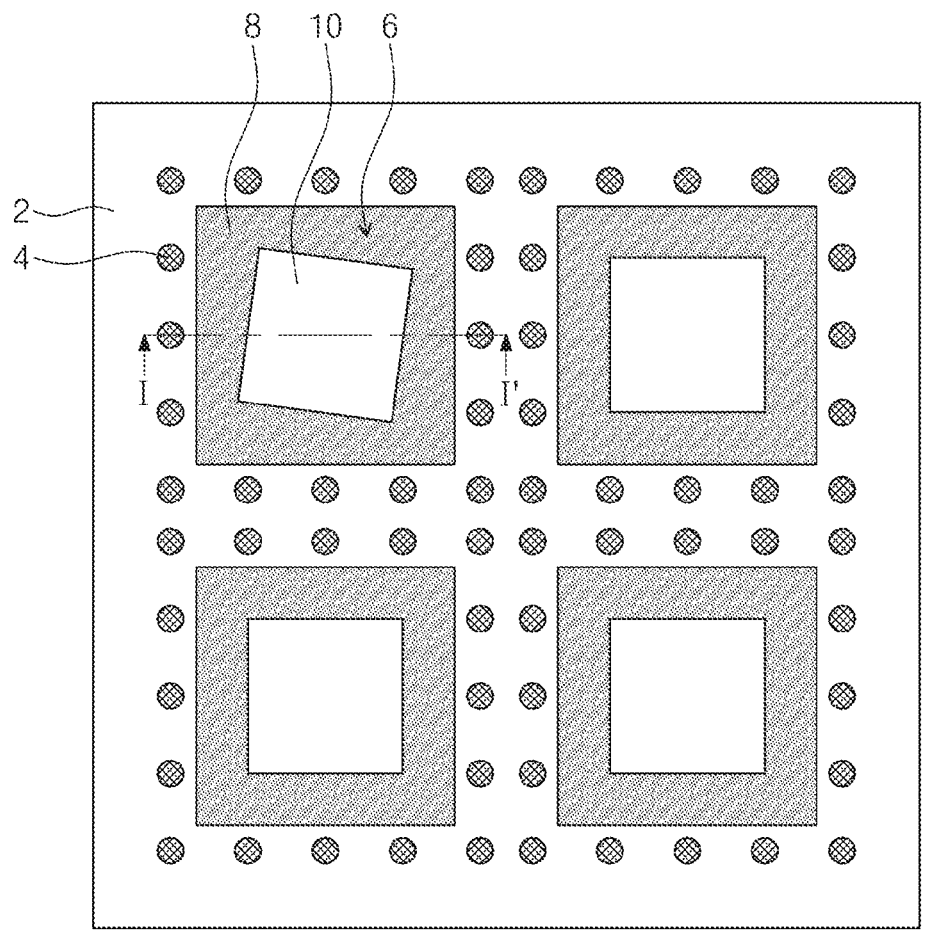
Figure 6B:
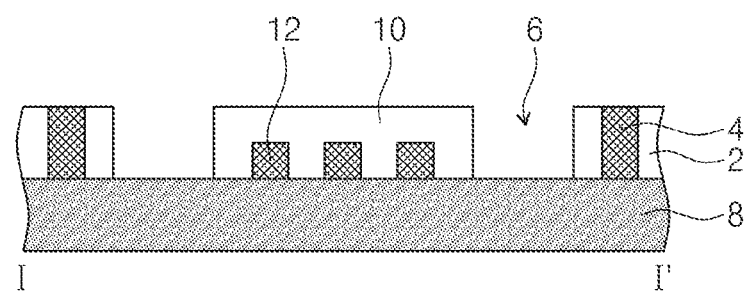

Referring to FIGS. 2, 6A, and 6B, the dies 10 may be provided on the dummy substrate 8 in the cavities 6, respectively (S140). The dies 10 may be provided into the cavities 6 by a picker (not shown). In some embodiments, each of the dies 10 may be a memory chip, or a semiconductor chip corresponding to an application processor (AP) chip. In some embodiments, each of the dies 10 may include a plurality of pad electrodes 12. The pad electrodes 12 may adhere to the dummy substrate 8. Each of the dies 10 may have a square shape smaller than the cavities 6.

Figure 7A:
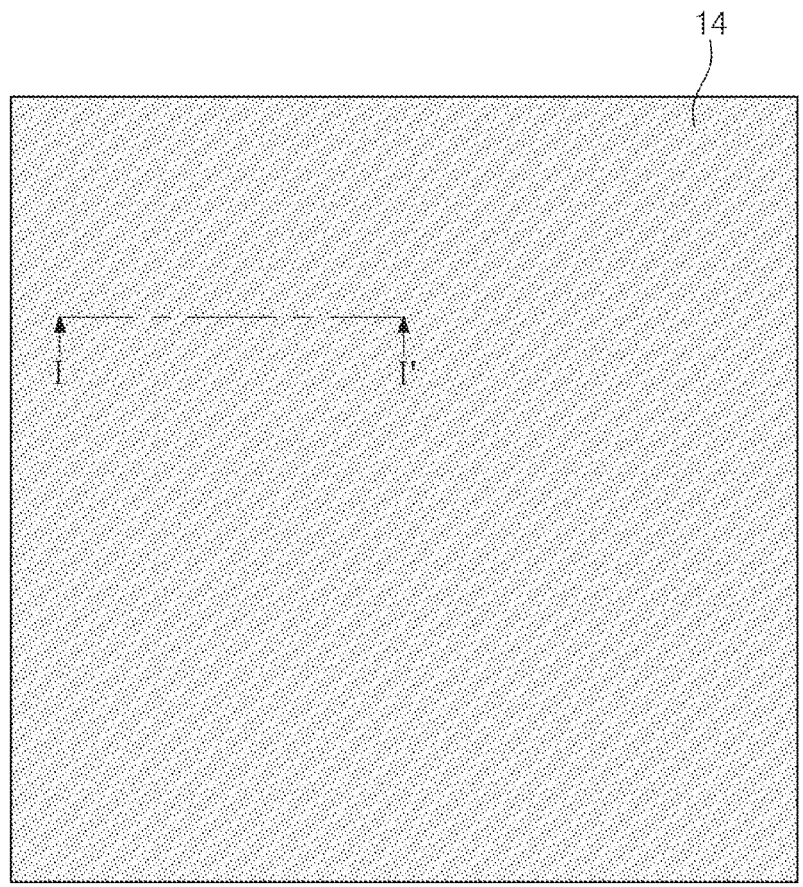
Figure 7B:
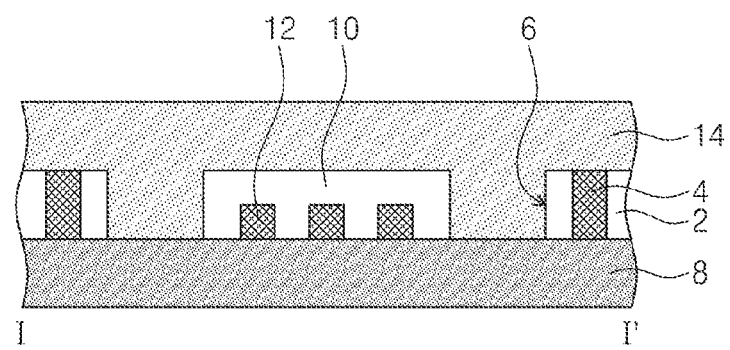

Referring to FIGS. 2, 7A, and 7B, the mold substrate 14 may be formed on the fan-out substrate 2, the dummy substrate 8, and the dies 10 (S150). For example, the mold substrate 14 may include resin or polymer. The mold substrate 14 may be melted at a high temperature. The melted mold substrate 14 may be provided onto the fan-out substrate 2, the dummy substrate 8, and the dies 10. Thereafter, the mold substrate 14 may be cooled to a room temperature so as to be hardened.

Figure 8A:
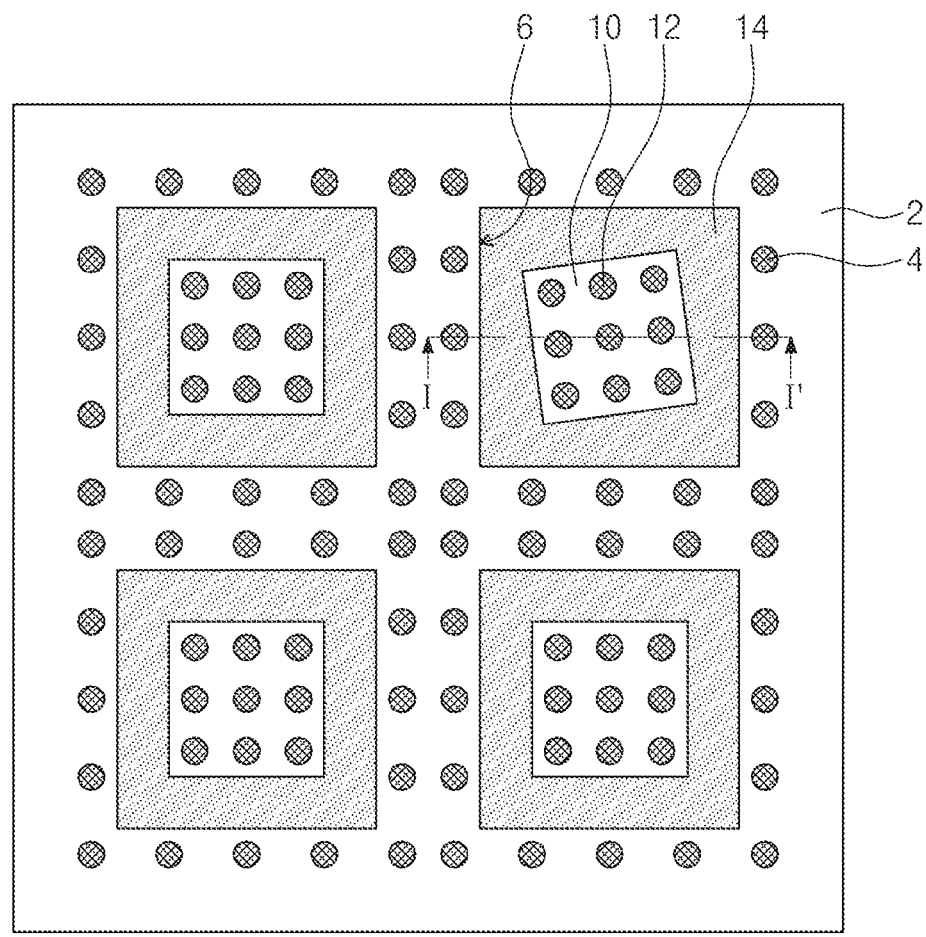
Figure 8B:
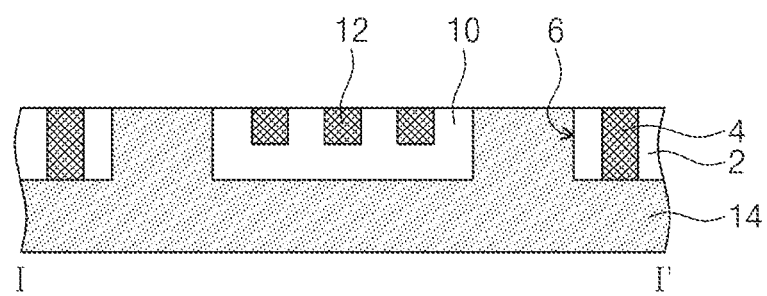

Referring to FIGS. 2, 8A, and 8B, the dummy substrate 8 may be removed (S160). The dummy substrate 8 may be peeled from the mold substrate 14, the fan-out substrate 2, and the dies 10 by external force. Thus, the pad electrodes 12 of the dies 10 may be exposed outward. The mold substrate 14, the fan-out substrate 2, and the dies 10 may be flipped or turned over such that the mold substrate 14 is disposed under the fan-out substrate 2 and the dies 10. For example, left and right portions of the mold substrate 14 may be rotated on a center line of the mold substrate 14, and thus the mold substrate 14 may be flipped or turned over.

Figure 9A:
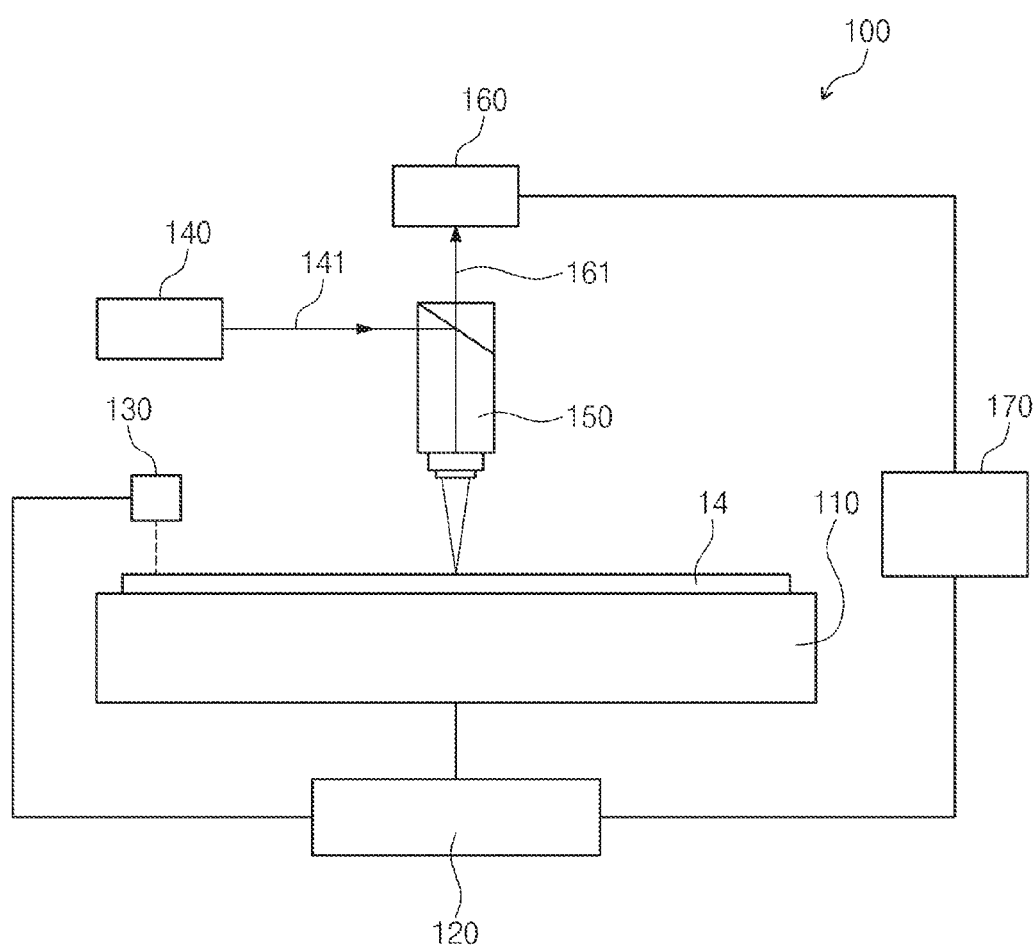
FIGS. 9A and 9B are schematic views illustrating first and second optical measurement apparatuses detecting positions of dies of FIGS. 8A and 8B.
Figure 9B:
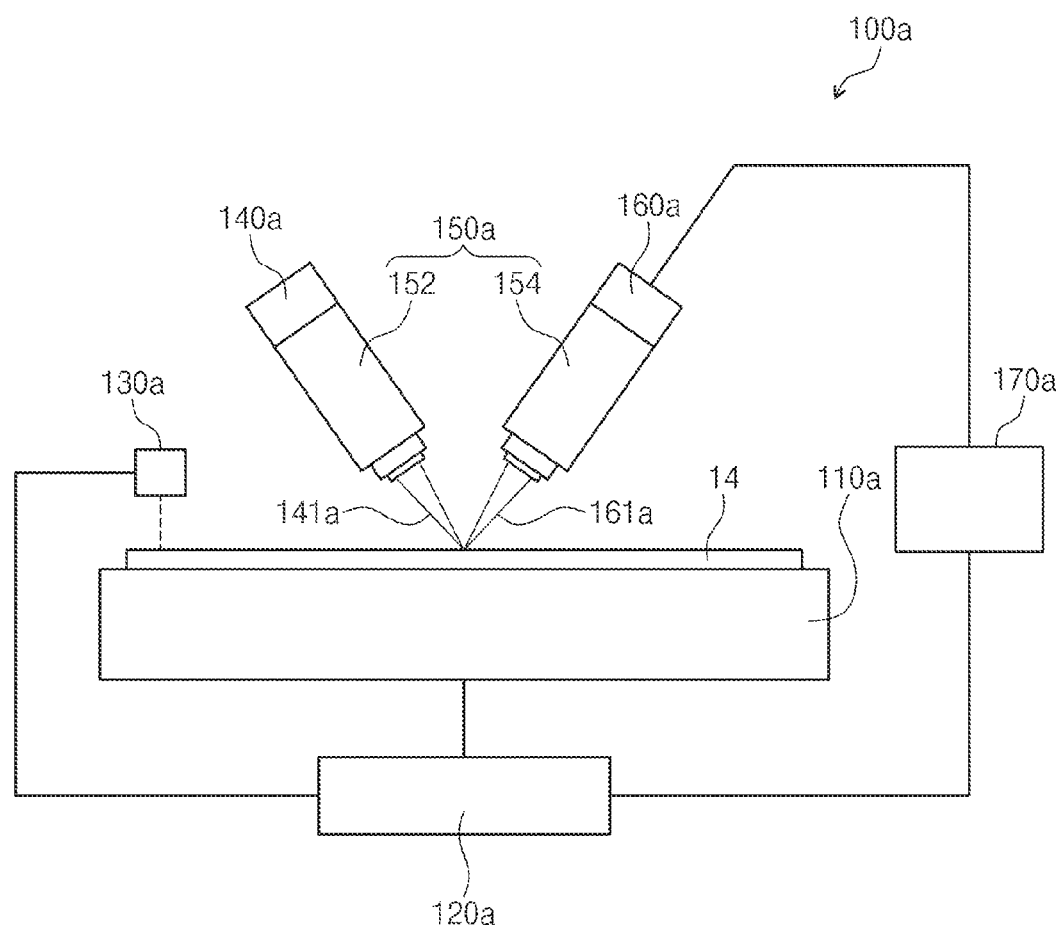
Figure 10:
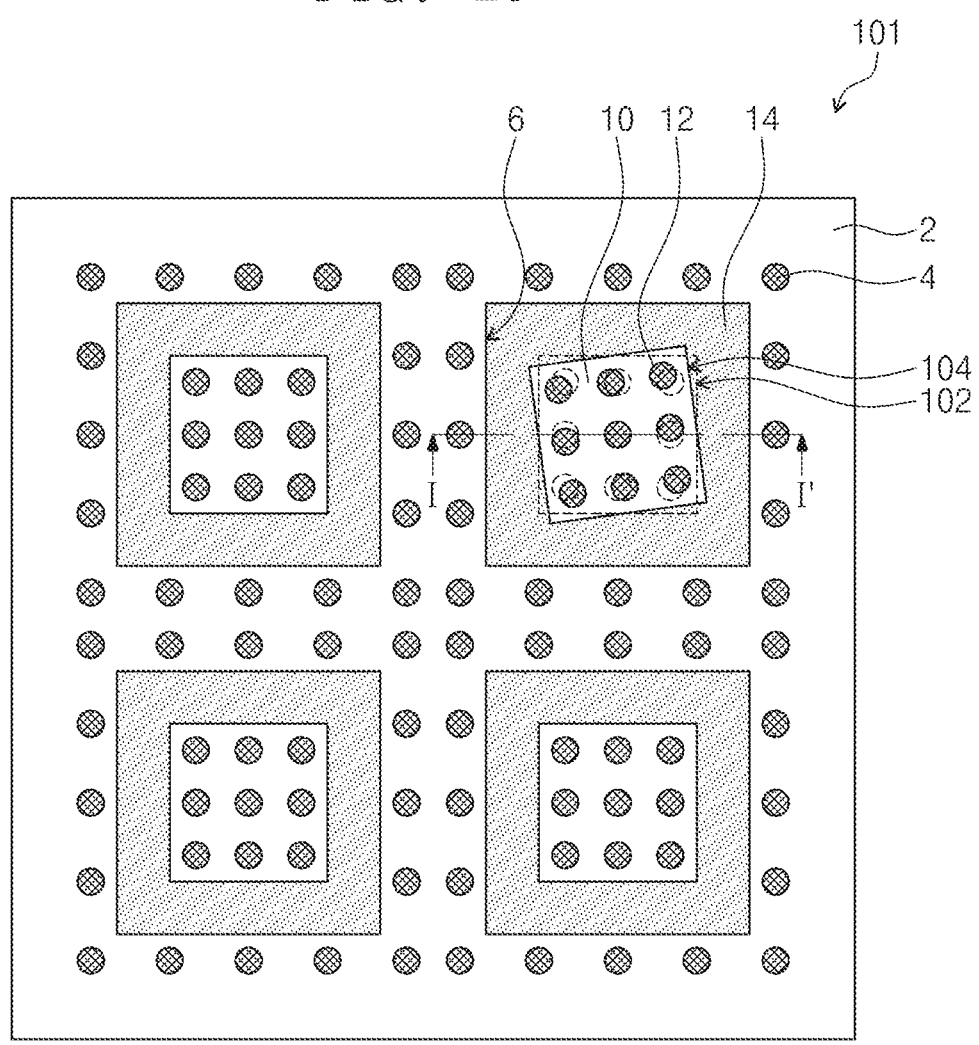
FIG. 10 illustrates an image detected by the optical measurement apparatuses of FIGS. 9A and 9B.

FIGS. 9A and 9B illustrate first and second optical measurement apparatuses 100 and 100a detecting positions of the dies 10 of FIGS. 8A and 8B. FIG. 10 illustrates a first image 101 detected by the first and second optical measurement apparatuses 100 and 100a of FIGS. 9A and 9B.

Referring to FIGS. 1, 9A, 9B, and 10, the first and second optical measurement apparatuses 100 and 100a may detect a position of each of the dies 10 on the mold substrate 14 in the operation S200. In some embodiments, the first and second optical measurement apparatuses 100 and 100a may obtain the first image 101 of the fan-out substrate 2 and the dies 10 on the mold substrate 14. The first and second optical measurement apparatuses 100 and 100a may calculate the position of each of the dies 10 with respect to the fan-out substrate 2 in the first image 101.

Referring to FIG. 9A, the first optical measurement apparatus 100 may be a coaxial optical system. In some embodiments, the first optical measurement apparatus 100 may include a first stage 110, a first driving control part 120, a first displacement sensor 130, a first light source part 140, a first projection part 150, a first detecting part 160, and a first control part 170. The first stage 110 may receive the mold substrate 14 and may horizontally move the mold substrate 14. The first driving control part 120 may control the movement of the first stage 110 and the mold substrate 14. The first displacement sensor 130 may sense a displacement of the mold substrate 14. The first driving control part 120 may receive a sensing signal of the first displacement sensor 130 to control the displacement of the mold substrate 14. The first light source part 140 may provide first incident light 141 to the first projection part 150. The first projection part 150 may provide the first incident light 141 to the mold substrate 14. In addition, the first projection part 150 may provide first reflected light 161, reflected from the mold substrate 14, to the first detecting part 160. The first detecting part 160 may detect an optical signal. For example, the first detecting part 160 may include an image sensor. The first control part 170 may obtain the first image 101 from the optical signal of the first detecting part 160. The first control part 170 may detect or calculate the positions of the dies 10 with respect to the fan-out substrate 2 in the first image 101.

Referring to FIG. 9B, the second optical measurement apparatus 100a may be an oblique optical system. In some embodiments, the second optical measurement apparatus 100a may include a second stage 110a, a second driving control part 120a, a second displacement sensor 130a, a second light source part 140a, a second projection part 150a, a second detecting part 160a, and a second control part 170a. The second stage 110a, the second driving control part 120a, the second displacement sensor 130a, the second light source part 140a, the second detecting part 160a, and the second control part 170a may be configured to be the same as the first stage 110, the first driving control part 120, the first displacement sensor 130, the first light source part 140, the first detecting part 160, and the first control part 170 of FIG. 9A, respectively. In some embodiments, the second projection part 150a may include an incident-light projection part 152 and a reflected-light projection part 154. The incident-light projection part 152 and the reflected-light projection part 154 may be connected to the second light source part 140a and the second detecting part 160a, respectively. The incident-light projection part 152 and the reflected-light projection part 154 may be disposed to be inclined with respect to the mold substrate 14. The incident-light projection part 152 and the reflected-light projection part 154 may be symmetrically disposed on the mold substrate 14. The incident-light projection part 152 may provide second incident light 141a to the mold substrate 14 in a first direction inclined with respect to a top surface of the mold substrate 14. The reflected-light projection part 154 may receive second reflected light 161a in a second direction inclined with respect to the top surface of the mold substrate 14. Here, the first direction and the second direction may be symmetrical.

Referring to FIGS. 9A, 9B, and 10, the first and second control parts 170 and 170a may detect or calculate a position of each of the dies 10 with respect to the fan-out substrate 2 in the first image 101. The first and second control parts 170 and 170a may read a pre-set position 102 of each of the dies 10 from a database (not shown). The detected position of at least one of the dies 10 may be different from the pre-set position 102 thereof. For example, one of the dies 10 may be displayed at a position 104, rotated with respect to the pre-set position 102, in the first image 101. In other words, the rotated position 104 may correspond to the detected position of one of the dies 10. In some embodiments, even though not shown in the drawings, the detected positions may include a position that is shifted in a transverse or longitudinal direction in the cavity 6 when viewed from a plan view.

The first and second control parts 170 and 170a may check whether the dies 10 are normally disposed in such a way that the detected positions of the dies 10 are in alignment tolerances of the pre-set positions 102 (S300). For example, the alignment tolerance of the pre-set position 102 may be about ±5 µm in the transverse direction or the longitudinal direction of the cavity 6. A rotation alignment tolerance of the pre-set position 102 may be ±0.1 degree. When a rotation angle between the pre-set position 102 and the rotated position 104 is beyond the rotation alignment tolerance (of, e.g., ±0.1 degree), the first and second control part 170 and 170a may check that the die 10 is not normally disposed. When the rotation angle between the pre-set position 102 and the rotated position 104 is in the rotation alignment tolerance (of, e.g., ±0.1 degree), the first and second control part 170 and 170a may check that the die 10 is normally disposed.

Referring to FIGS. 1, 9A, 9B, and 10, when the detected positions of one or more of the dies 10 are abnormal, the first and second control parts 170 and 170a may store addresses of the dies 10 abnormally disposed beyond the a ion) alignment tolerance into the database (not shown) (S310). Thereafter, the operation S600 of forming the interconnection lines may not be performed on the abnormal dies 10.

When the positions of the dies 10 are normal, second control parts 170 and 170a may store data of the detected positions of the dies 10 into the database (S400). The stored position data may be used in the operation S600 of forming the interconnection lines.

Figure 11A:
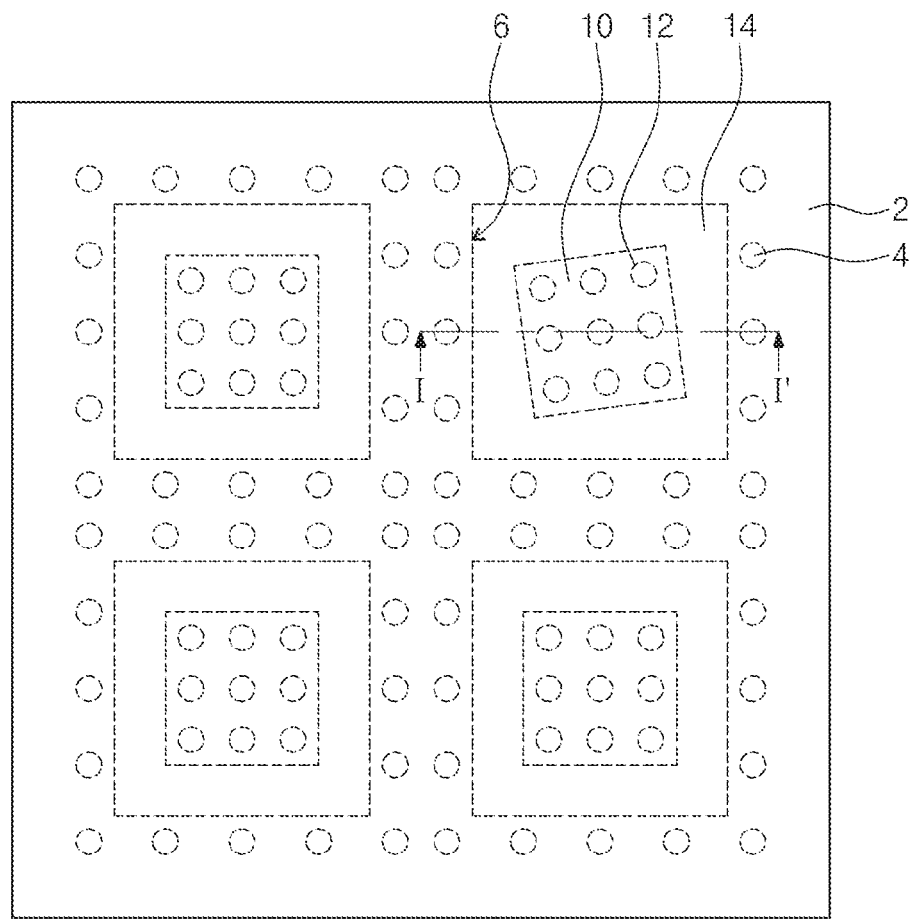
FIG. 11A is a plan view illustrating an embodiment of an operation of forming an interlayer insulating layer in FIG. 1.
Figure 11B:
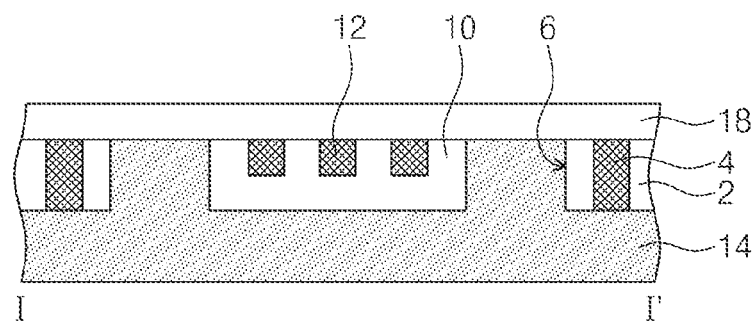
FIG. 11B is a cross-sectional view taken along a line I-I' of FIG. 11A.

FIG. 11A is a plan view illustrating an embodiment of the operation S500 of forming the interlayer insulating layer 18 in FIG. 1. FIG. 11B is a cross-sectional view taken along a line I-I' of FIG. 11A.

Referring to FIGS. 1, 11A, and 1113, an interlayer insulating layer 18 may be formed on the fan-out substrate 2, the dies 10, and the mold substrate 14 (S500). For example, the interlayer insulating layer 18 may include a silicon oxide layer or a silicon nitride layer, which is formed by a chemical vapor deposition (CVD) method. Alternatively, the interlayer insulating layer 18 may include silica or transparent polymer, which is formed by a spin-coating method or a sol-gel method.

Figure 12:
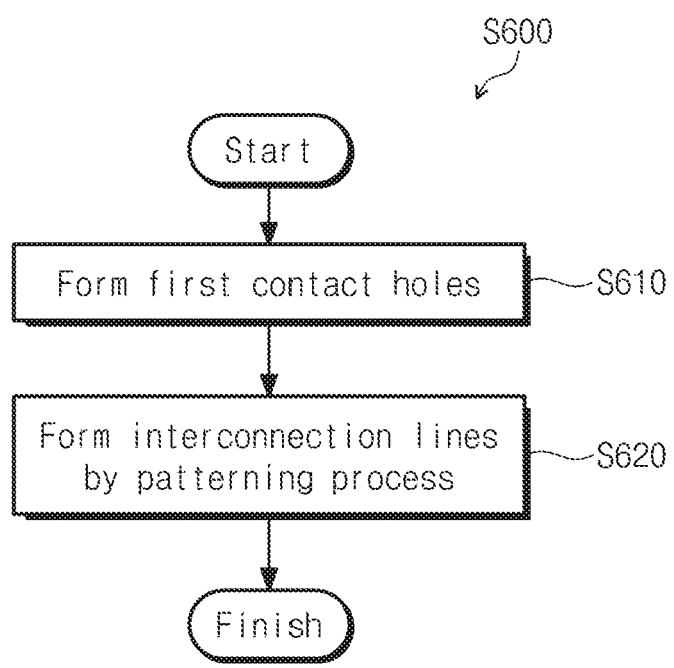
FIG. 12 is a flow chart illustrating an embodiment of an operation of forming interconnection lines in FIG. 1.

FIG. 12 illustrates an embodiment of the operation S600 of forming the interconnection lines in FIG. 1.

Referring to FIG. 12, the operation S600 of forming the interconnection lines may include forming first contact holes (S610) and forming the interconnection lines by a patterning process (S620). The operation S610 of forming the first contact holes may be an operation of removing portions of the interlayer insulating layer 18 to expose the pad electrodes 12 of the dies 10 and the substrate electrodes 4 of the fan-out substrate 2. The operation S620 of forming the interconnection lines by the patterning process may be an operation of electrically connecting the exposed pad electrodes 12 to the exposed substrate electrodes 4.

Figure 13:
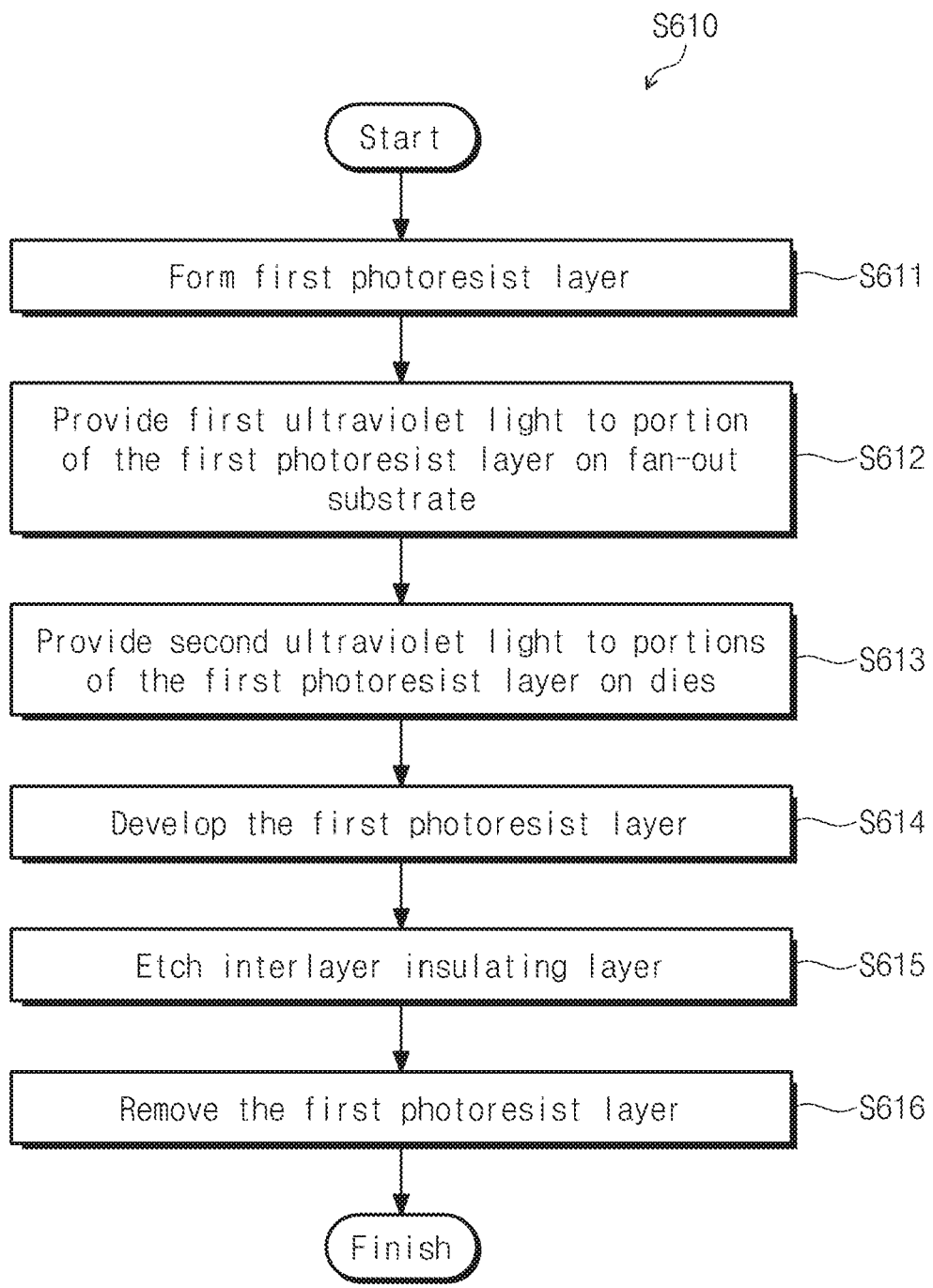
FIG. 13 is a flow chart illustrating an embodiment of an operation of forming first contact holes in FIG. 12.

FIG. 13 illustrates an embodiment of the operation S610 of forming the first contact holes 16 in FIG. 12. FIGS. 14A to 19A are plan views illustrating an embodiment of the operation S610 of forming the first contact holes in FIG. 12. FIGS. 14B to 19B are cross-sectional views taken along lines I-I' of FIGS. 14A to 19A, respectively.

Referring to FIGS. 13, 14A to 19A, and 14B to 19B, the operation S610 of forming the first contact holes 16 may include performing a plurality of exposure processes on a first photoresist layer 20 formed on the fan-out substrate 2 and the dies 10. In some embodiments, the operation S610 of forming the first contact holes 16 may include forming the first photoresist layer 20 (S611), providing first ultraviolet light 241 (S612), providing second ultraviolet light 251 (S613), developing the first photoresist layer 20 (S614), etching portions of the interlayer insulating layer 18 (S615), and removing the first photoresist layer 20 (S616).

Figure 14A:
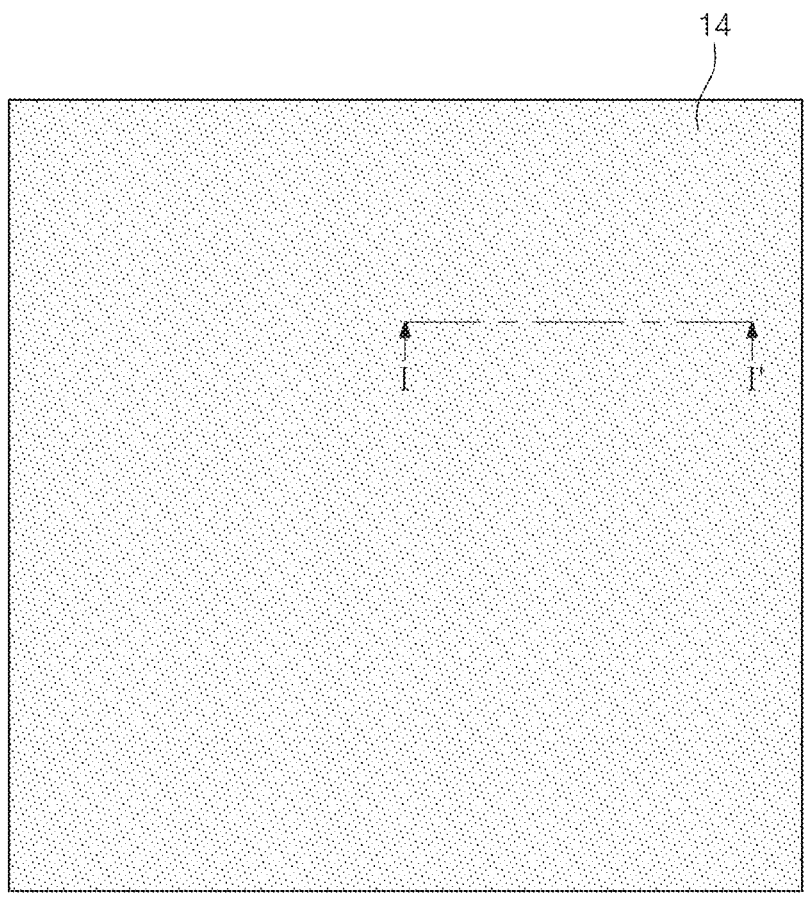
Figure 14B:
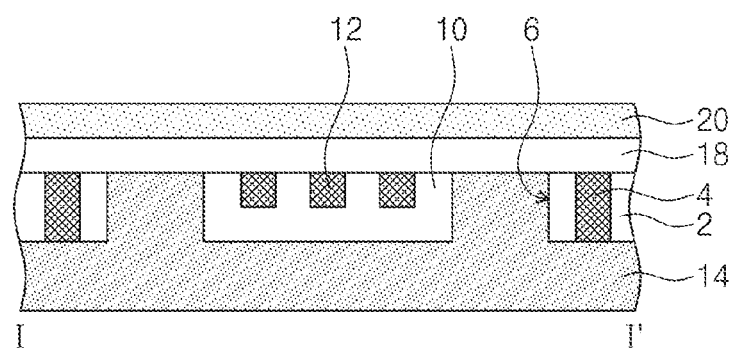
Figure 15A:
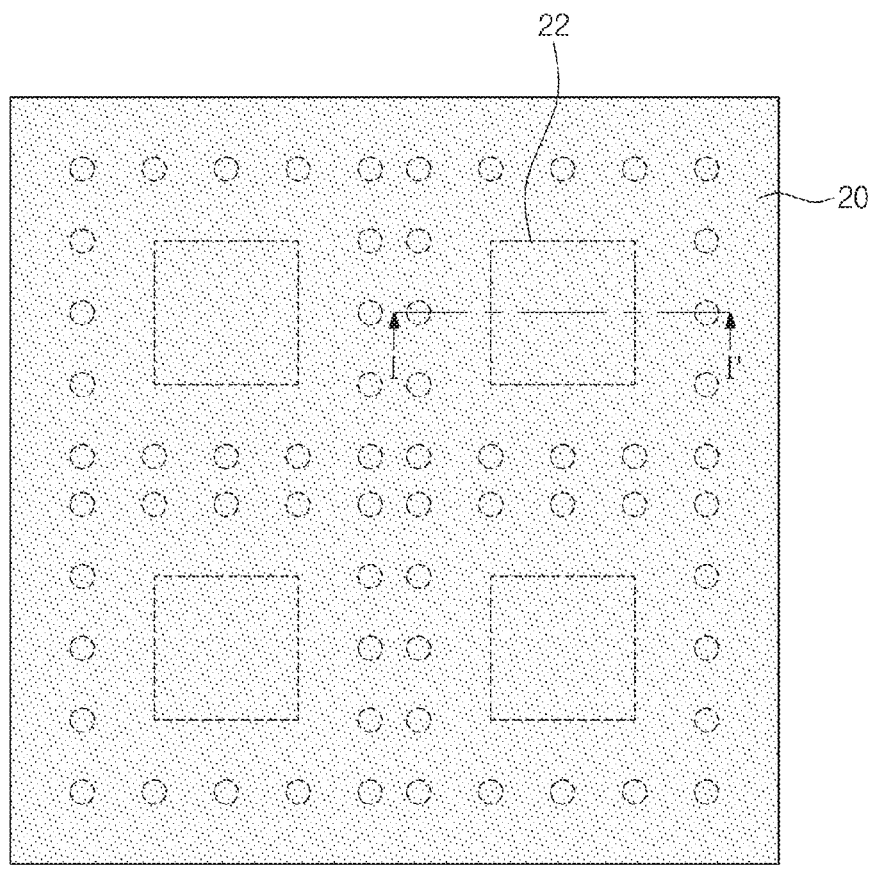
Figure 15B:
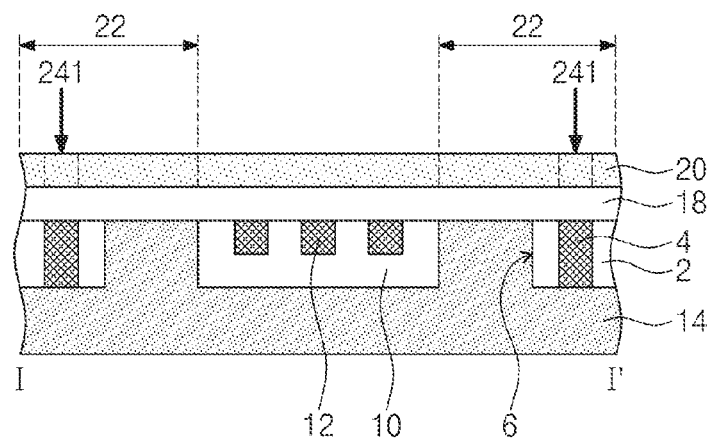
Figure 16A:
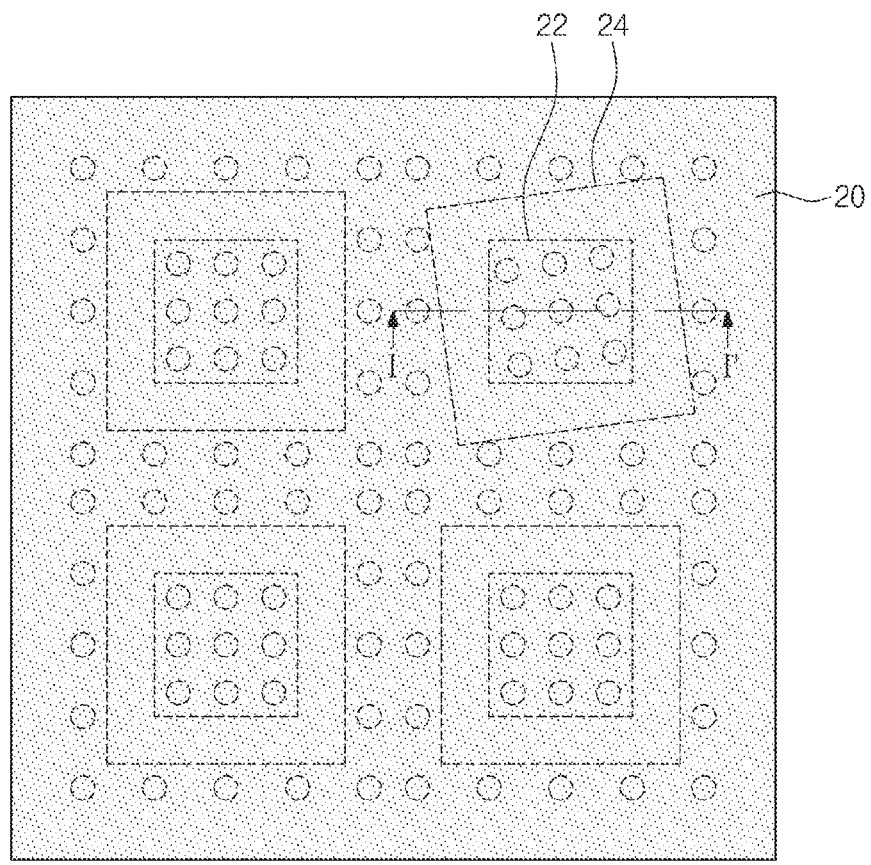
Figure 16B:
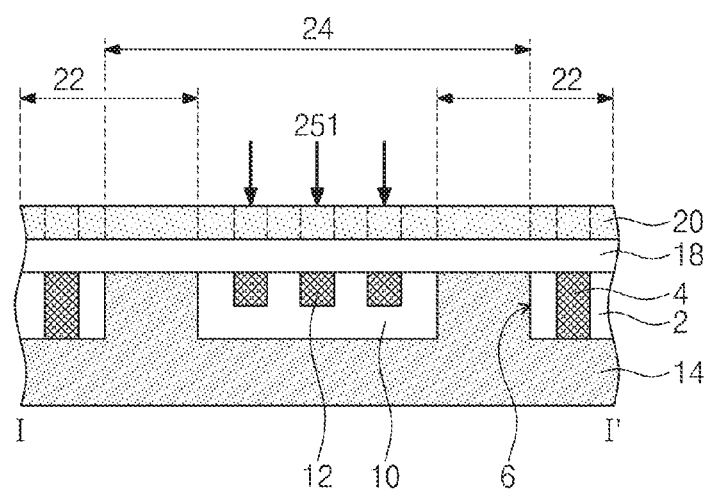

Referring to FIGS. 13, 14A, and 14B, the first photoresist layer 20 may be formed on the interlayer insulating layer 18 (S611). The first photoresist layer 20 may be formed on the interlayer insulating layer 18 by a spin-coating method. Thereafter, the first photoresist layer 20 may be hardened by a bake process. For example, the first photoresist layer 20 may include a positive photoresist.

Figure 20:
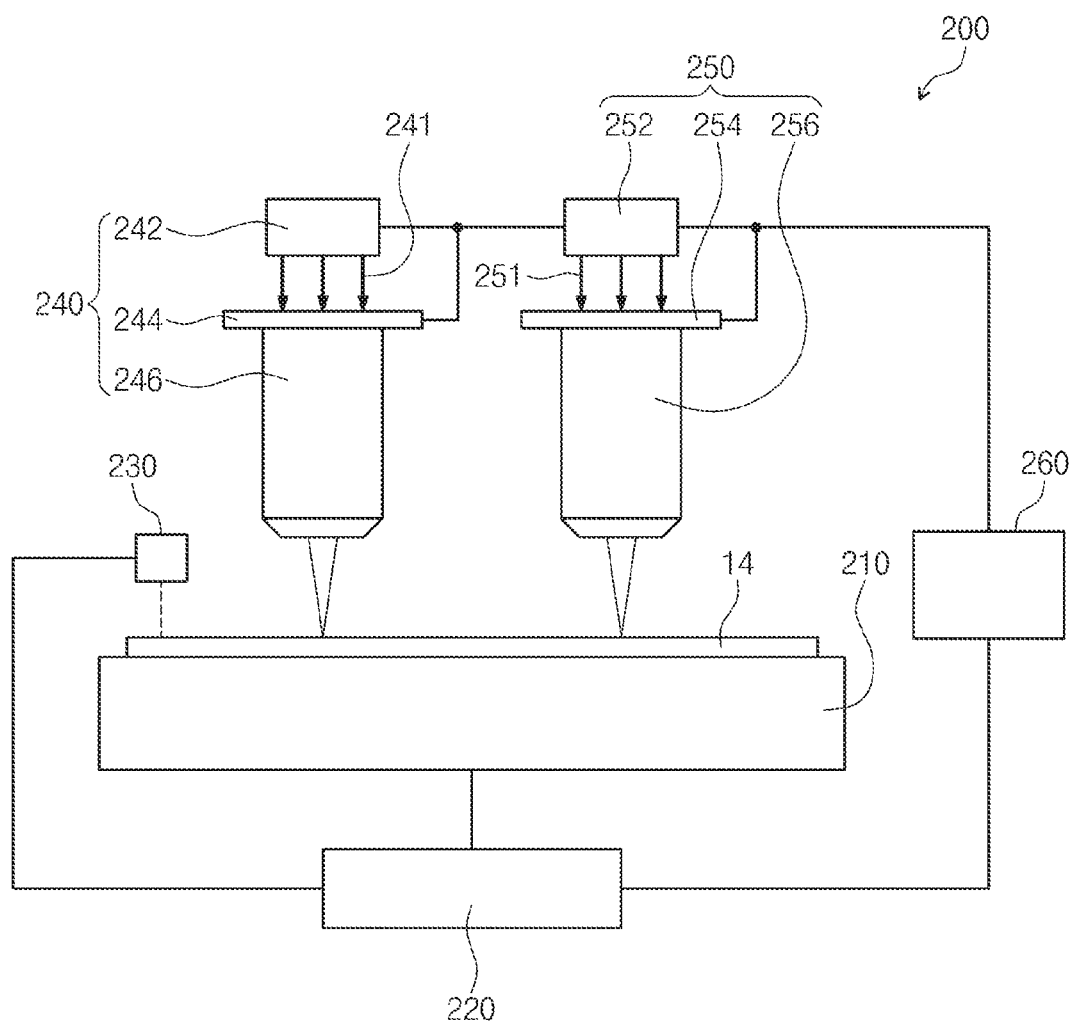
FIG. 20 is a schematic view illustrating an embodiment of an exposure apparatus performing an exposure process on a first photoresist layer of FIGS. 14A and 14B.

FIG. 20 illustrates an embodiment of an exposure apparatus 200 for exposing the first photoresist layer 20 of FIGS. 14A and 14B.

Referring to FIG. 20, the exposure apparatus 200 may be a double exposure apparatus. In some embodiments, the exposure apparatus 200 may include a third stage 210, a third driving control part 220, a third displacement sensor 230, a first exposure part 240, a second exposure part 250, and a third control part 260. The third driving control part 220 may control the third stage 210. The third displacement sensor 230 may detect a position of the mold substrate 14. The first and second exposure parts 240 and 250 may be disposed above the third stage 210. The first and second exposure parts 240 and 250 may be adjacent to each other. For example, the first exposure part 240 may include a first exposure light source 242, a first reticle 244, and a first exposure objection lens 246. The first exposure light source 242 may generate the first ultraviolet light 241. The first reticle 244 may be disposed between the first exposure light source 242 and the first exposure objection lens 246. The first reticle 244 may transmit a portion of the first ultraviolet light 241. The first exposure objection lens 246 may provide or project the first ultraviolet light 241 onto the first photoresist layer 20. A pattern image of the first reticle 244 may be transferred to the first photoresist layer 20 by the first ultraviolet light 241. The second exposure part 250 may include a second exposure light source 252, a second reticle 254, and a second exposure objection lens 256. The second exposure light source 252 may generate the second ultraviolet light 251. The second reticle 254 may be disposed between the second exposure light source 252 and the second exposure objection lens 256. The second reticle 254 may transmit a portion of the second ultraviolet light 251. The second exposure objection lens 256 may provide or project the second ultraviolet light 251 onto the first photoresist layer 20. A pattern image of the second reticle 254 may be transferred to the first photoresist layer 20 by the second ultraviolet light 251.

Referring to FIGS. 13, 15A, 15B, and 20, the first exposure part 240 may provide the first ultraviolet light 241 to a portion of the first photoresist layer 20 disposed on the fan-out substrate 2 (S612). In some embodiments, the pattern image of the first reticle 244 may be defined as a first shot 22. The first ultraviolet light 241 may be provided to the portion, disposed around the dies 10, of the first photoresist layer 20 through the first shot 22. For example, the first ultraviolet light 241 may be provided to the first photoresist layer 20 disposed on the substrate electrodes 4.

Referring to FIGS. 10, 13, 16A, 16B, and 20, the second exposure part 250 may provide the second ultraviolet light 251 to other portions of the first photoresist layer 20 disposed on the dies 10 (S613). In some embodiments, the pattern image of the second reticle 254 may be defined as a second shot 24. The second ultraviolet light 251 may be provided to the portions, disposed on the cavities 6, of the first photoresist layer 20 through the second shot 24. The second shot 24 may overlap with the first shot 22 on the cavities 6 disposed between the fan-out substrate 2 and the dies 10. The third control part 260 may read the detected position data of the dies 10 from the database. The second exposure part 250 may provide the second ultraviolet light 251 to the portions, disposed on the dies 10, of the first photoresist layer 20 on the basis of the detected position data. For example, the third control part 260 may move the second exposure part 250 to the position 104 rotated from the pre-set position 102. In some embodiments, the second exposure part 250 may provide the second ultraviolet light 251 to the first photoresist layer 20 disposed on the pad electrodes 12 of the rotated position 104.

Figure 17A:
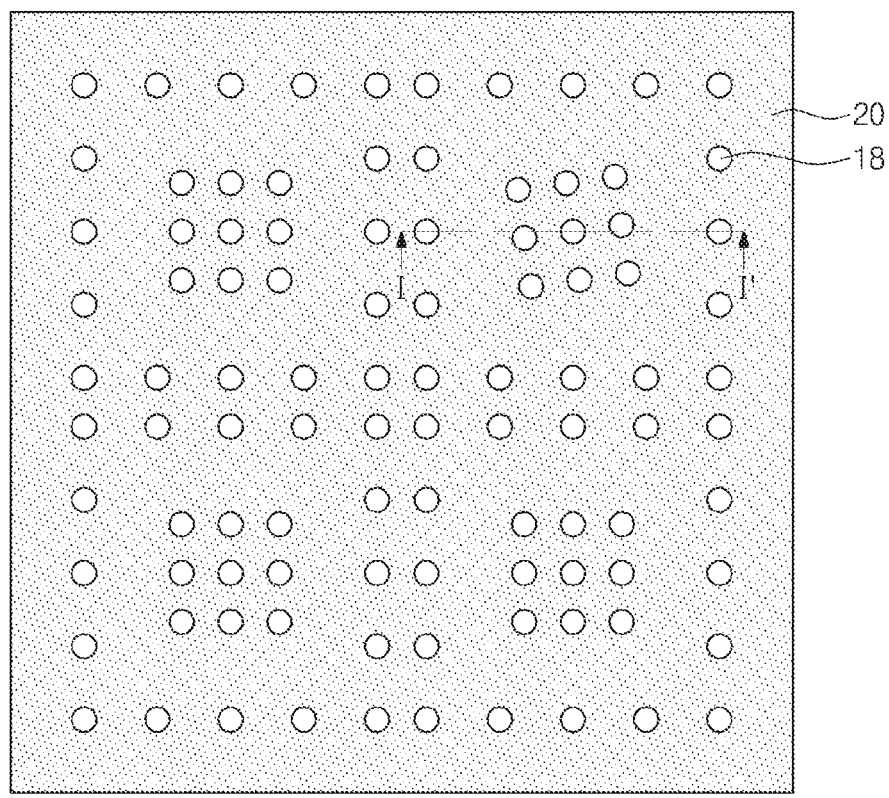
Figure 17B:
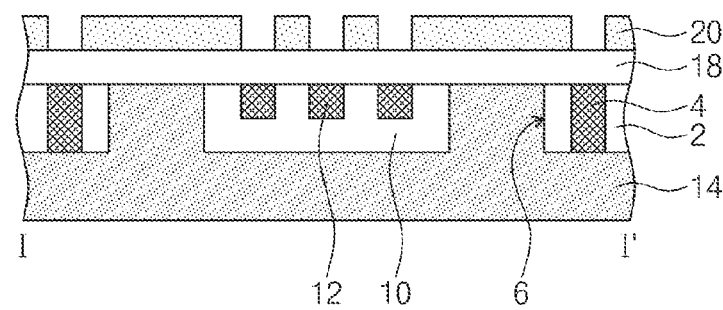

Referring to FIGS. 13, 17A, and 1713, the first photoresist layer 20 may be developed to expose portions of the interlayer insulating layer 18 (S614). The portions of the interlayer insulating layer 18, which are disposed on the substrate electrodes 4 and the pad electrodes 12, may be exposed by the first photoresist layer 20 developed. In other words, the first photoresist layer 20 may be formed to expose the interlayer insulating layer 18 disposed on the pad electrodes 12 of the rotated die 10.

Figure 18A:
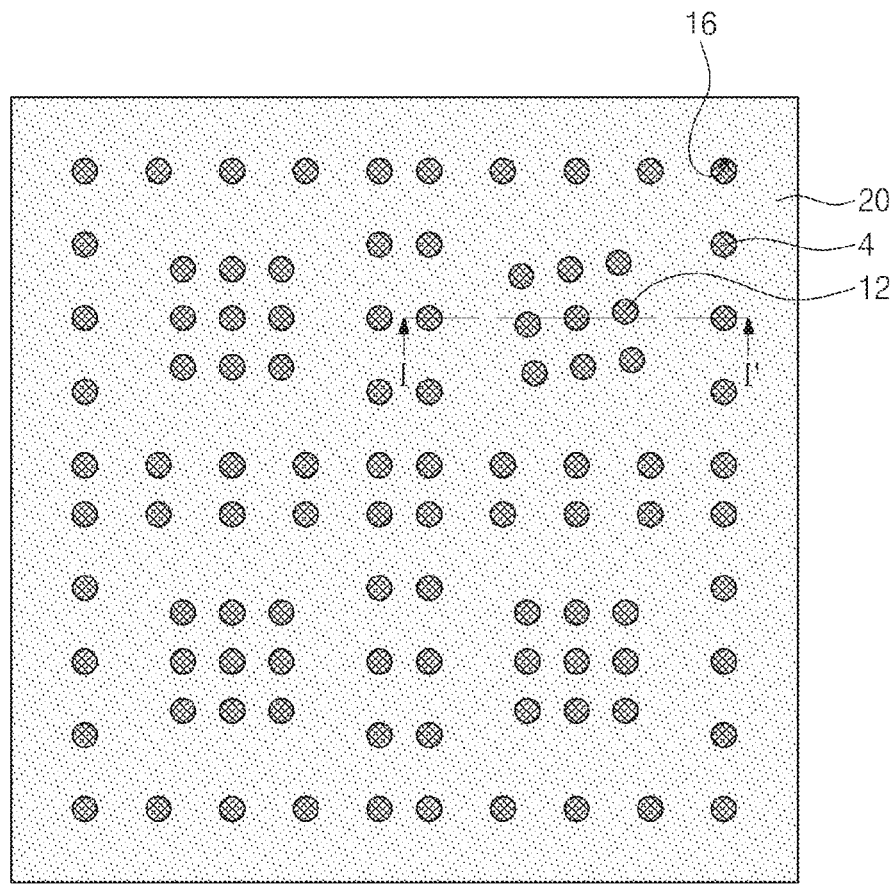
Figure 18B:
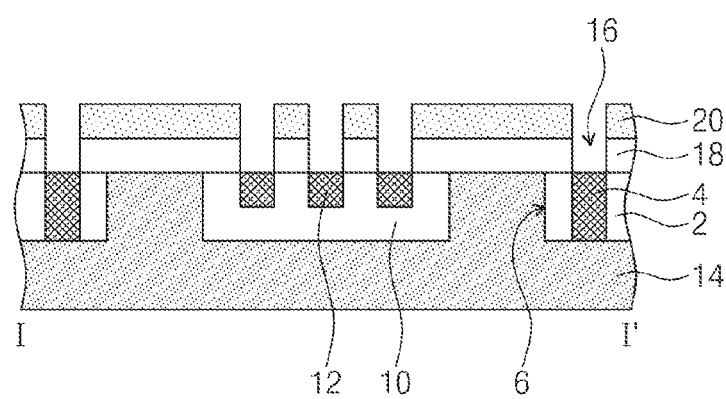
Figure 19A:
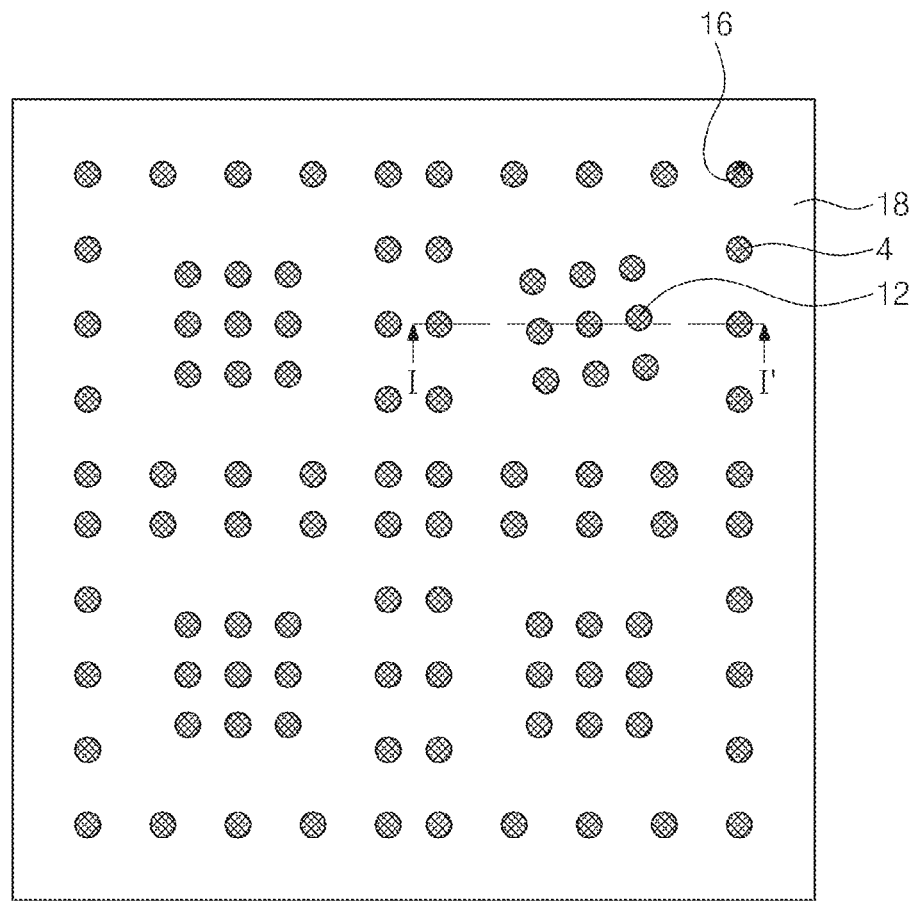
Figure 19B:
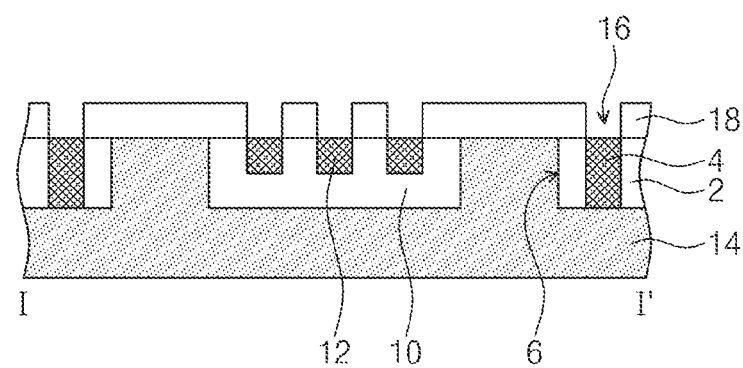

Referring to FIGS. 13, 18A, and 1813, the exposed portions of the interlayer insulating layer 18 may be etched to form the first contact holes 16 (S615). The first contact holes 16 may expose the substrate electrodes 4 and the pad electrodes 12.

Referring to FIGS. 10, 13, 19A, and 19B, the first photoresist layer 20 may be removed (S616). The first photoresist layer 20 may be removed by an organic solvent such as alcohol or acetone. Thus, the first contact holes 16 may be formed on the substrate electrodes 4 and the pad electrodes 12 of the rotated position 104. As a result, it is possible to minimize or prevent a defect of the first contact holes 16 which may be caused by misalignment in the alignment tolerance of the fan-out substrate 2 and the dies 10.

Figure 21:
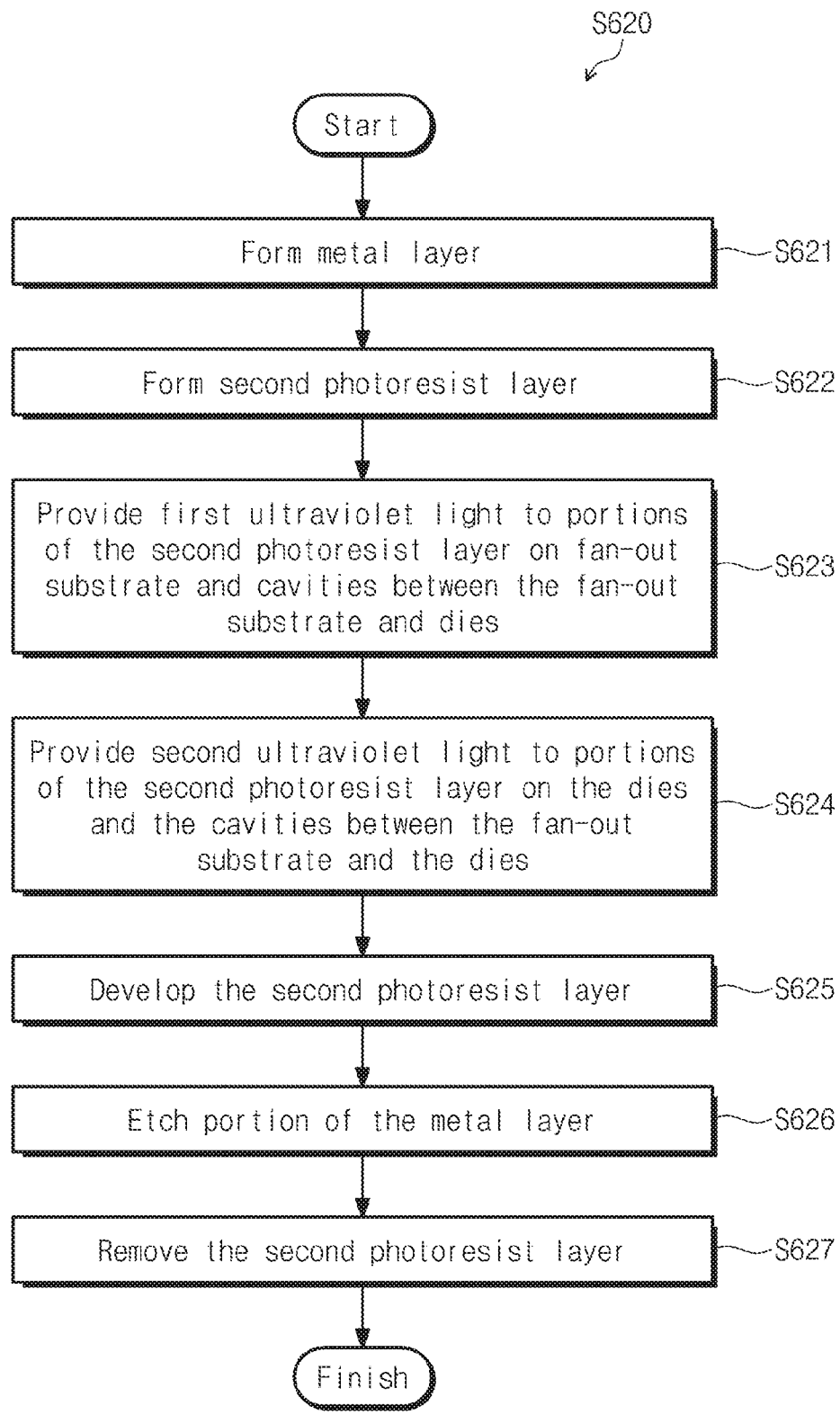
FIG. 21 is a flow chart illustrating an embodiment of an operation of forming interconnection lines by a patterning process in FIG. 12.

FIG. 21 illustrates an embodiment of the operation S620 of forming the interconnection lines 40 by the patterning process in FIG. 12. FIGS. 22A to 28A are plan views illustrating an embodiment of the operation S620 of forming the interconnection lines 40 by the patterning process in FIG. 12. FIGS. 22B to 28B are cross-sectional views taken along lines I-F of FIGS. 22A to 28A, respectively.

Referring to FIGS. 20, 21, 22A to 28A, and 2213 to 2813, the operation S620 of forming the interconnection lines 40 by the patterning process may include performing a plurality of exposure processes on a second photoresist layer 32 formed on the fan-out substrate 2 and the dies 10. At this time, the plurality of exposure processes may use a partial overlapping exposure method. In some embodiments, the operation S620 of forming the interconnection lines by the patterning process may include forming a metal layer 30 (S621), forming the second photoresist layer 32 (S622), providing first ultraviolet light 241 (S623), providing second ultraviolet light 251 (S624), developing the second photoresist layer 32 (S625), etching a portion of the metal layer 30 (S626), and removing the second photoresist layer 32 (S627).

Figure 22A:
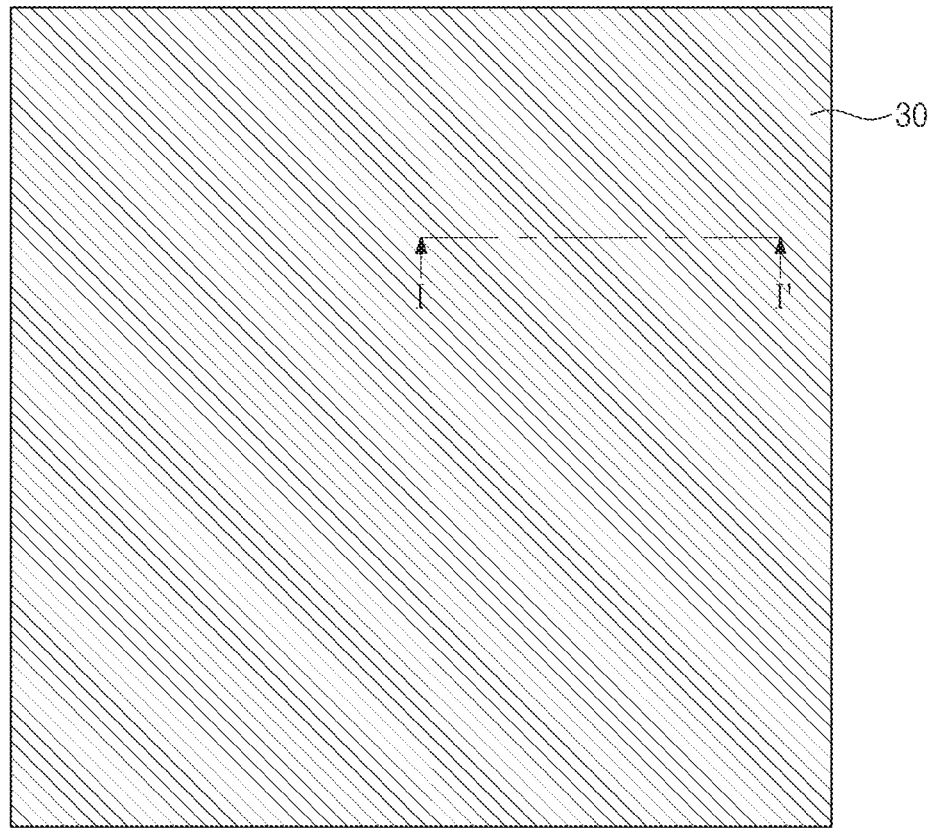
Figure 22B:
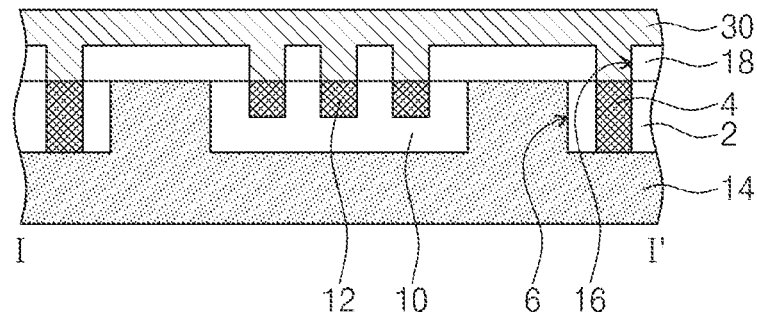

Referring to FIGS. 21, 22A, and 22B, the metal layer 30 may be formed on the interlayer insulating layer 18, the substrate electrodes 4, and the pad electrodes 12 (S621). For example, the metal layer 30 may include aluminum or tungsten formed by a physical vapor deposition (PVD) method.

Figure 23A:
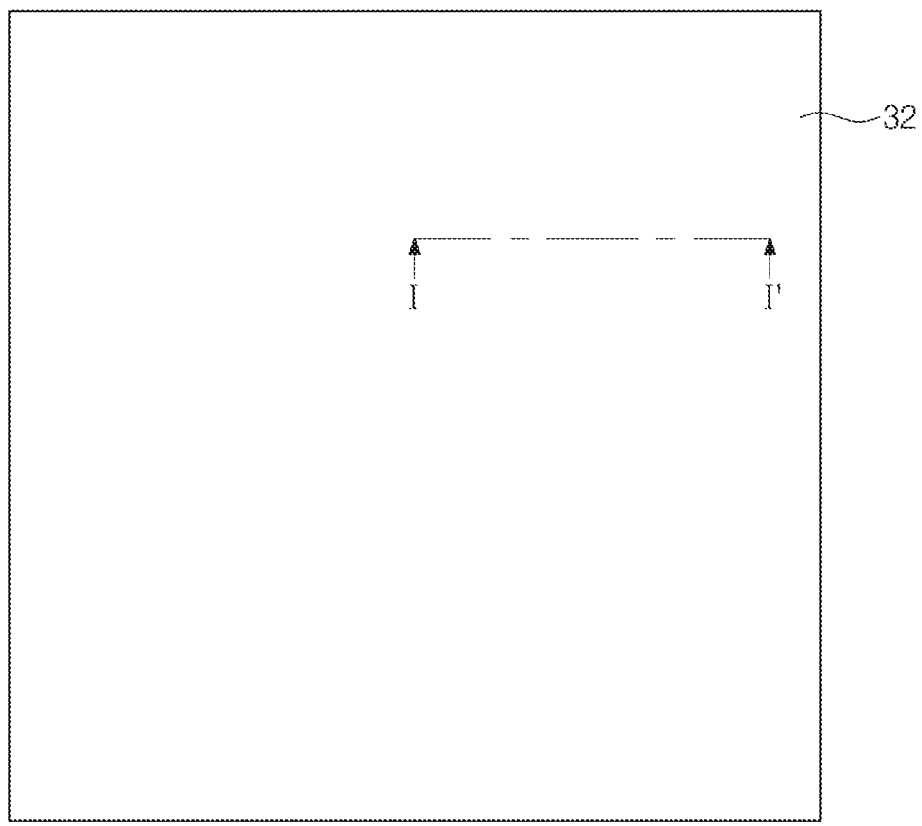
Figure 23B:
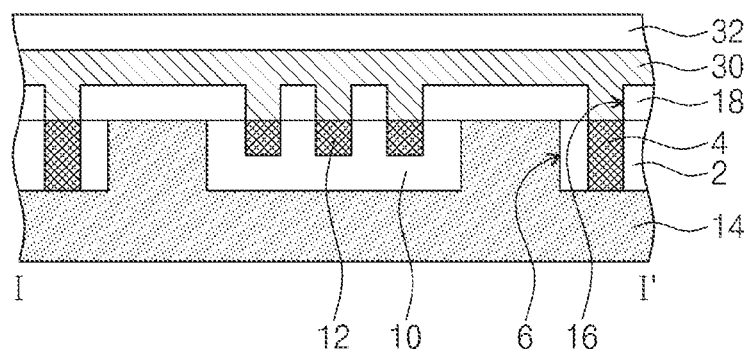

Referring to FIGS. 21, 23A, and 23B, the second photoresist layer 32 may be formed on the metal layer 30 (S622). The second photoresist layer 32 may be formed on the metal layer 30 by a spin-coating method. For example, the second photoresist layer 32 may include a negative photoresist.

Referring to FIGS. 20, 21, 24A, and 2413, the first exposure part 240 may provide the first ultraviolet light 241 to a portion of the second photoresist layer 32 which is disposed on the fan-out substrate 2 and the cavities 6 disposed between the fan-out substrate 2 and the dies 10 (S623). In some embodiments, a pattern image of a first reticle 244 for forming the interconnection lines may be defined as a third shot 34. The first ultraviolet light 241 may be provided to the portion, disposed around the dies 10, of the second photoresist layer 32 through the third shot 34. The third shot 34 (e.g., the first ultraviolet light 241) may be provided to portions of the second photoresist layer 32 disposed between the substrate electrodes 4 and the pad electrodes 12 in a plan view and portions of the second photoresist layer 32 disposed on the substrate electrodes 4. In other words, the portions of the second photoresist layer 32, which are exposed to the first ultraviolet light 241, may be disposed on the substrate electrodes 4 and between the substrate electrodes 4 and the dies 10.

Figure 24A:
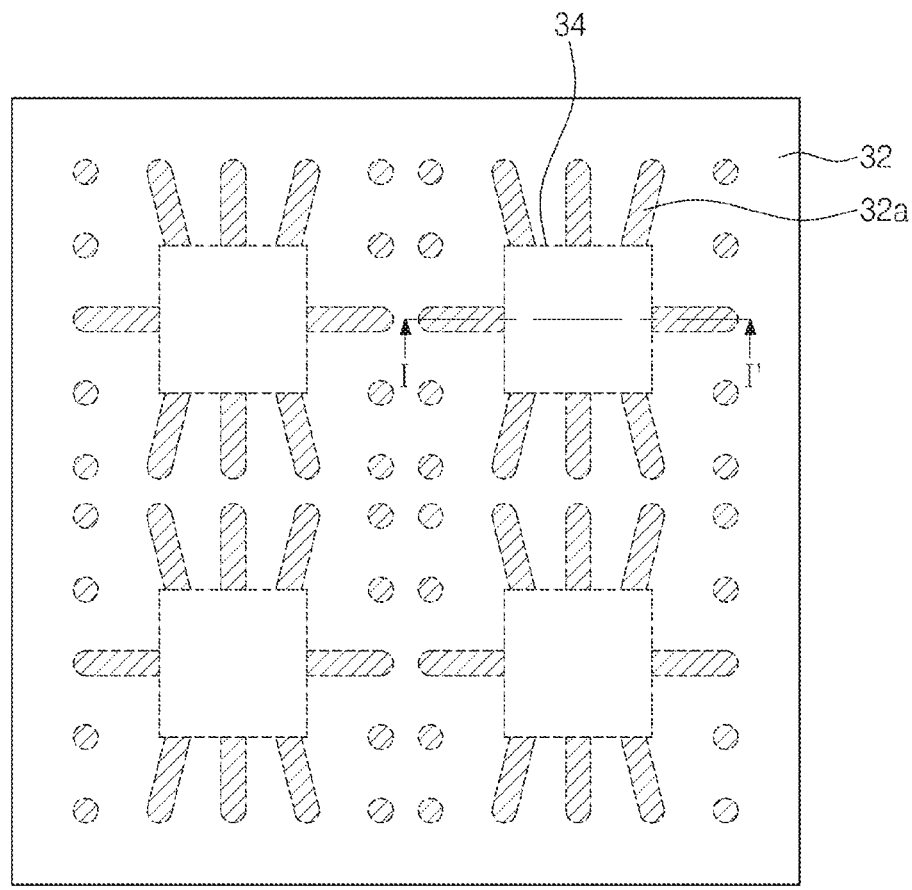
Figure 24B:
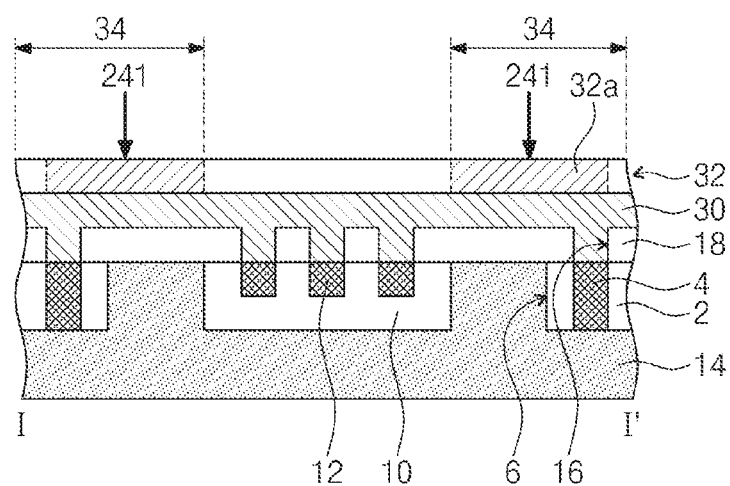

Referring to FIGS. 10, 24A, and 24B, the second photoresist layer 32 may include first interconnection exposure portions 32a. The first interconnection exposure portions 32a may laterally extend from on the substrate electrodes 4 of the fan-out substrate 2 to the dies 10 of the pre-set positions 102.

Alternatively, when the second photoresist layer 32 is a positive photoresist, the first ultraviolet light 241 may be provided to the second photoresist layer 32 disposed around the substrate electrodes 4 except portions of the second photoresist layer 32 disposed between the substrate electrodes 4 and the pad electrodes 12.

Referring to FIGS. 20, 21, 25A, and 25B, the second exposure part 250 may provide the second ultraviolet light 251 to portions of the second photoresist layer 32 which are disposed on the dies 10 and the cavities 6 between the fan-out substrate 2 and the dies 10 (S624). In some embodiments, a pattern image of a second reticle 254 for forming the interconnection lines may be defined as a fourth shot 36. The second ultraviolet light 251 may be provided to the portions, disposed on the cavities 6, of the second photoresist layer 32 through the fourth shot 36. The fourth shot 36 may overlap with the third shot 34 on the second photoresist layer 32 disposed on the cavities 6 between the fan-out substrate 2 and the dies 10. The third control part 260 may read the detected position data of the dies 10 from the database. The second exposure part 250 may expose the portions, disposed on the cavities 6 and the dies 10, of the first photoresist layer 32 on the basis of the detected position data. For example, the third control part 260 may move the second exposure part 250 to the position 104 rotated from the pre-set position 102. The second exposure part 250 may provide the second ultraviolet light 251 to portions of the second photoresist layer 32 disposed between the substrate electrodes 4 and the pad electrodes 12 in a plan view and portions of the second photoresist layer 32 disposed on the pad electrodes 12. In other words, the portions of the second photoresist layer 32, which are exposed to the second ultraviolet light 251, may be disposed on the pad electrodes 12 and between the fan-out substrate 2 and the pad electrodes 12.

Figure 25A:
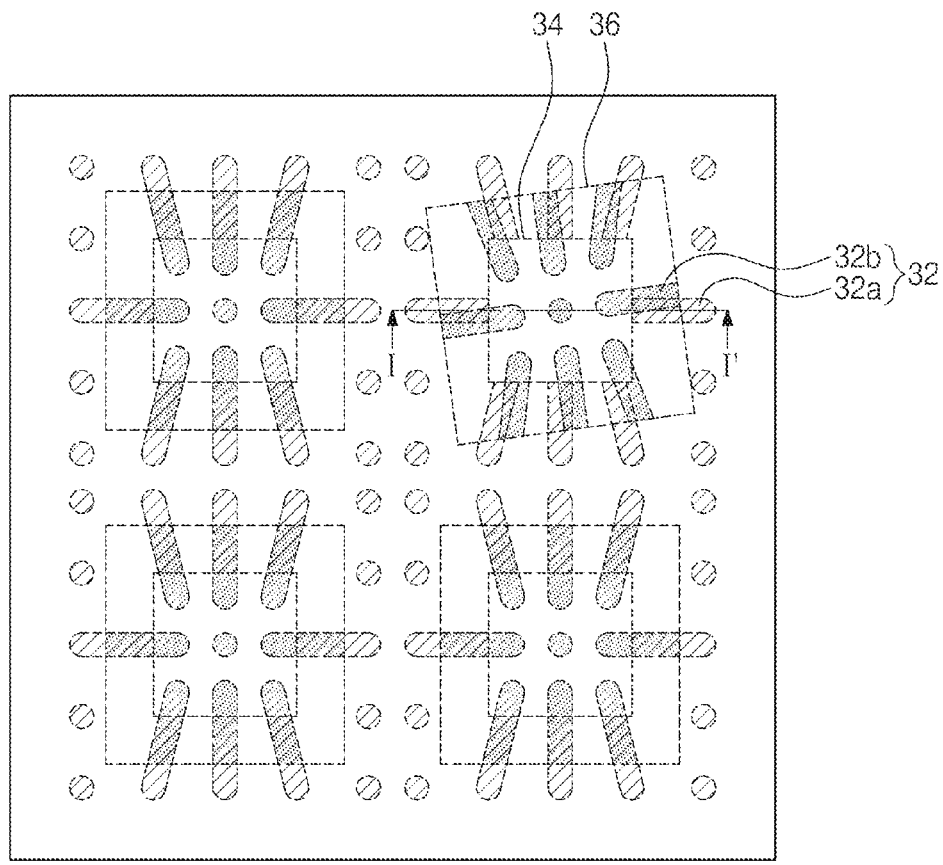
Figure 25B:
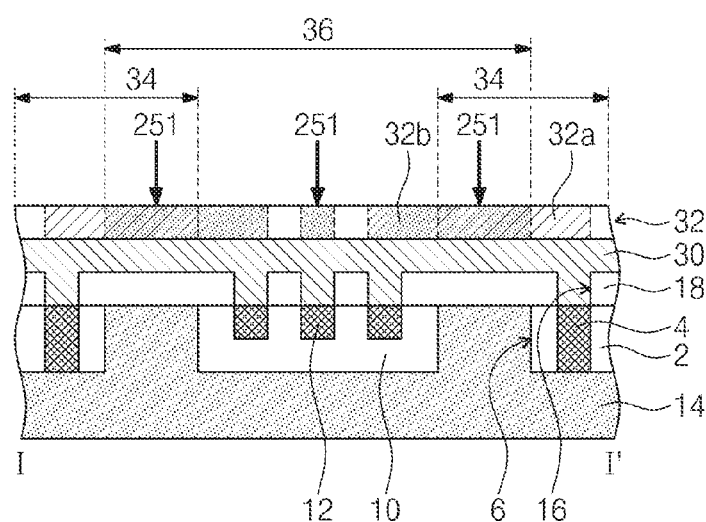

Referring to FIGS. 10, 25A, and 25B, the second photoresist layer 32 may include second interconnection exposure portions 32b. The second interconnection exposure portions 32b may laterally extend from on the pad electrodes 12 of the dies 10 of the detected positions to the fan-out substrate 2. The first interconnection exposure portions 32a may overlap with the second interconnection exposure portions 32b between the fan-out substrate 2 and the dies 10 when viewed from a plan view. For example, widths of the overlapping portions of the first and second interconnection exposure portions 32a and 32b may be increased between the die 10 disposed at the rotated position 104 and the fan-out substrate 2.

Alternatively, when the second photoresist layer 32 is the positive photoresist, the second exposure part 250 may provide the second ultraviolet light 251 to the second photoresist layer 32 disposed on the dies 10 and the cavities 6 between the fan-out substrate 2 and the dies 10 (including the rotated die 10) except portions of the second photoresist layer 32 disposed between the pad electrodes 12 and the substrate electrodes 4 in a plan view and except portions of the second photoresist layer 32 disposed on the pad electrodes 12.

Figure 26A:
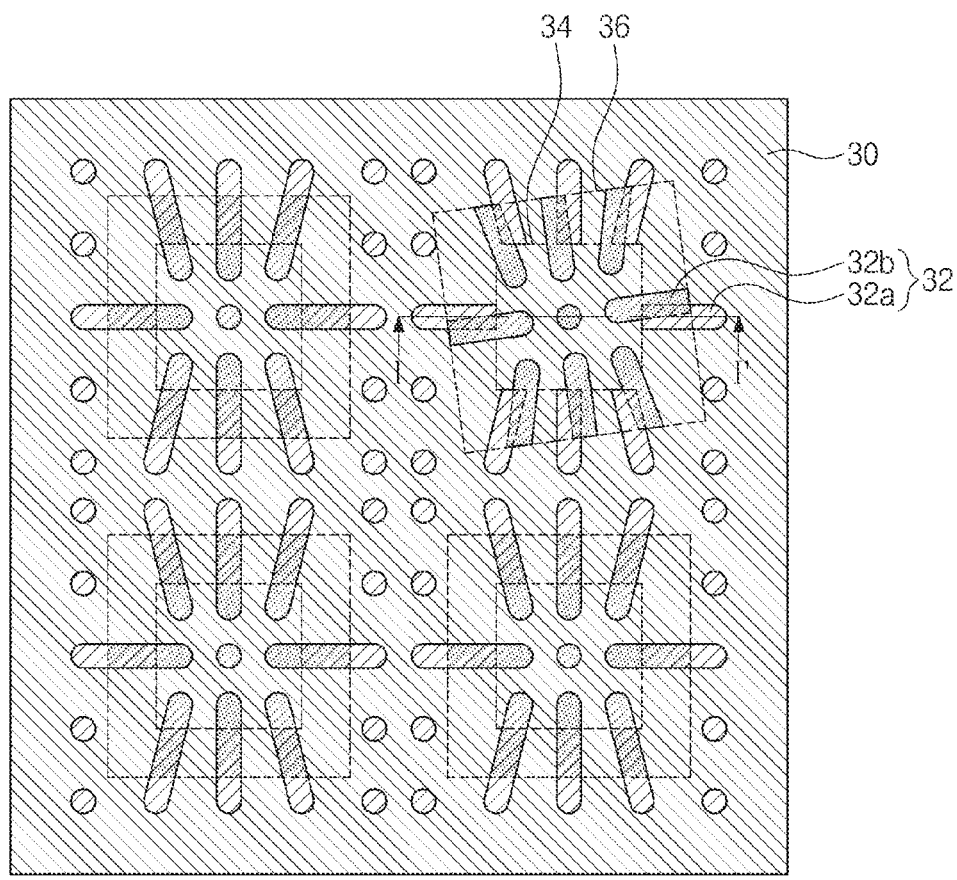
Figure 26B:
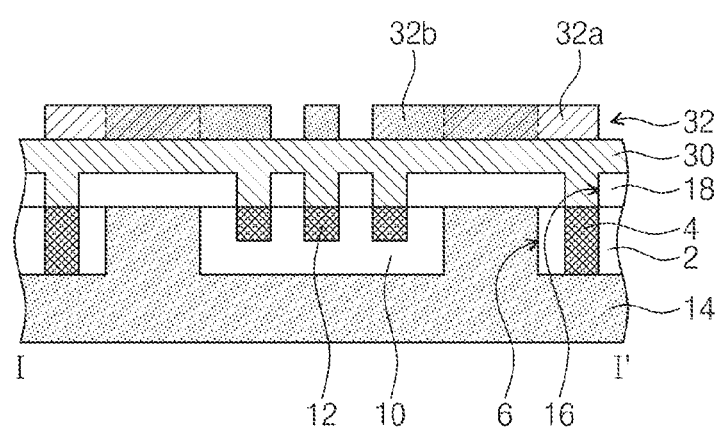

Referring, to FIGS. 21, 26A, and 2613, the second photoresist layer 32 may be developed to expose portions of the metal layer 30 (S625). The first interconnection exposure portions 32a and the second interconnection exposure portions 32b may remain on the metal layer 30 after the developing process. Portions the first interconnection exposure portions 32a may cover the substrate electrodes 4, and portions of the second interconnection exposure portions 32b may cover the pad electrodes 12.

Figure 27A:
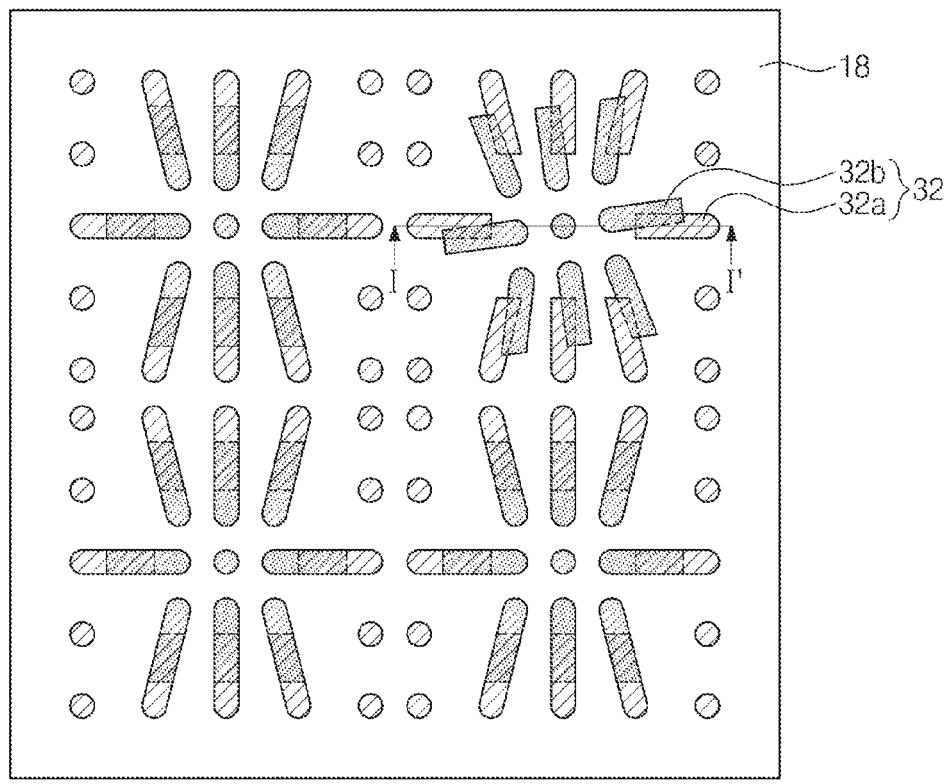
Figure 27B:
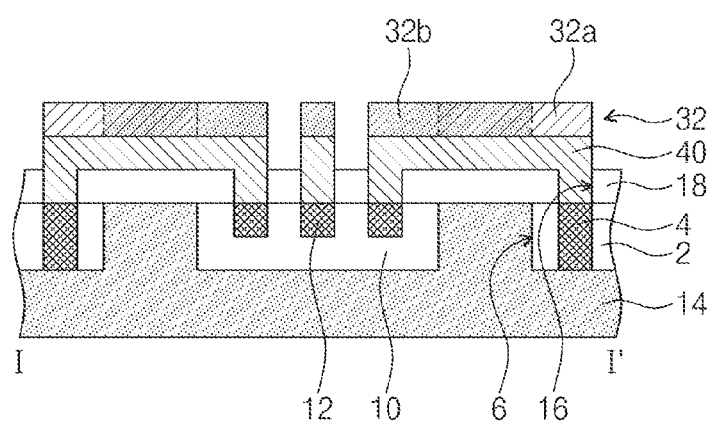

Referring to FIGS. 21, 27A, and 27B, the metal layer 30 exposed the first and second interconnection exposure portions 32a and 32b may be removed to form the interconnection lines 40 (S626). The metal layer 30 may be etched by a dry etching method.

Figure 28A:
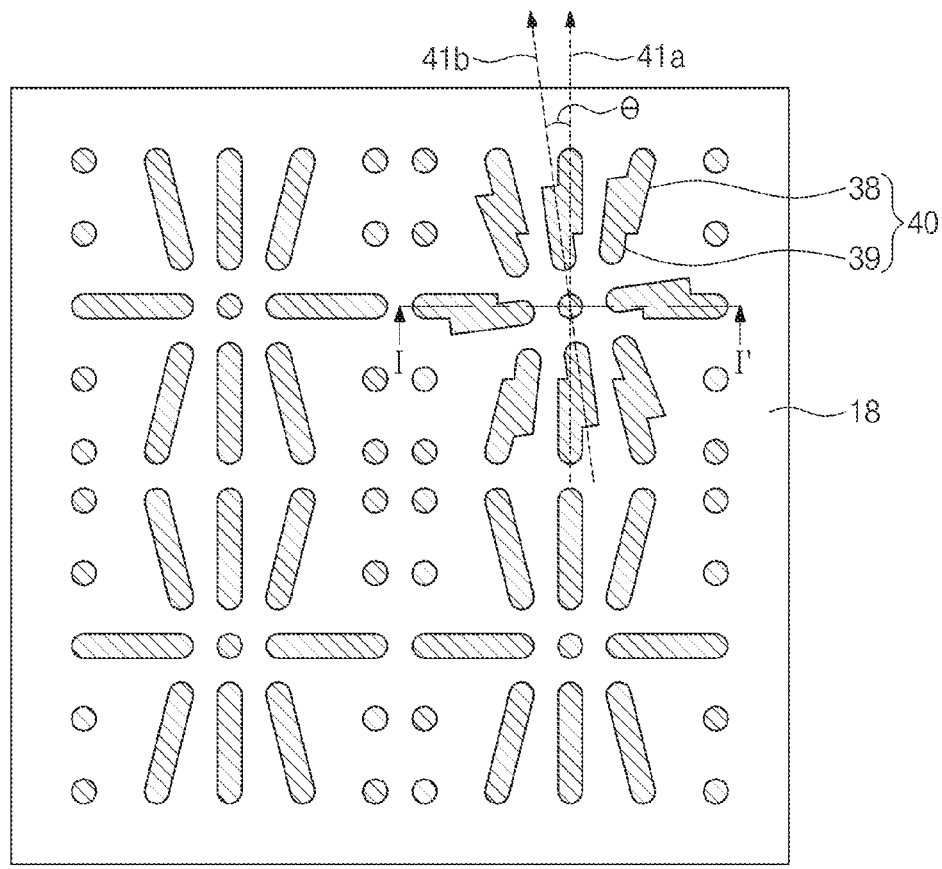
Figure 28B:
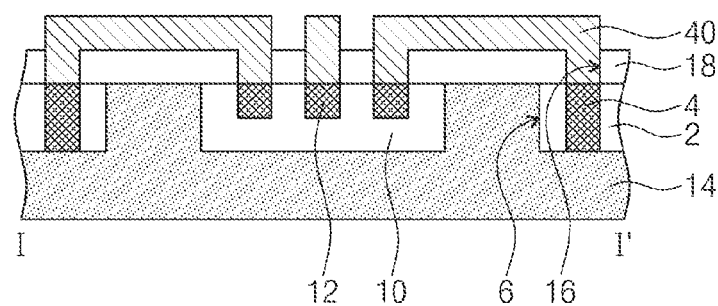

Referring to FIGS. 21, 28A, and 28B, the first and second interconnection exposure portions 32a and 32b of the second photoresist layer 32 may be removed (S627). Thus, the interconnection lines 40 may be exposed outward. The interconnection lines 40 may be disposed on portions of the interlayer insulating layer 18, the substrate electrodes 4, and the pad electrodes 12. The interconnection lines 40 may electrically connect the substrate electrodes 4 to the pad electrodes 12.

Referring to FIGS. 10, 28A, and 28B, widths of the interconnection lines 40 connected to the die 10 disposed at the rotated position 104 may be greater than widths of the interconnection lines 40 connected to the dies 10 disposed at the pre-set positions 102. For example, the widths of the interconnection lines 40 may be increased on the cavity 6 between the fan-out substrate 2 and the die 10 disposed at the rotated position 104. Some of the interconnection lines 40 may extend from the substrate electrodes 4 of the fan-out substrate 2 onto the dies 10 of the pre-set positions 102. Others of the interconnection lines 40 may extend from the pad electrodes 12 of the die 10 of the rotated position 104 onto the fan-out substrate 2. As described above, the first and second interconnection exposure portions 32a and 32b of FIG. 27A, which are disposed on the cavity 6 between the fan-out substrate 2 and the die 10 of the rotated position 104, may not be completely aligned with each other but may partially overlap with each other. Thus, the interconnection lines 40 on disposed on the cavity 6 between the fan-out substrate 2 and the die 10 of the rotated position 104 may have increased widths and may not be broken. Since the widths of the interconnection lines 40 connected to the die 10 of the rotated position 104 are increased in the alignment tolerance, the interconnection lines 40 may electrically connect the pad electrodes 12 of the die 10 of the rotated position 104 to the substrate electrodes 4. As a result, it is possible to minimize or prevent a defect of the interconnection lines 40 which may be caused by misalignment in the alignment tolerance of the fan-out substrate 2 and the dies 10.

Referring to FIGS. 28A and 28B, each of the interconnection lines 40 may include a first portion 38 and a second portion 39. The first portion 38 and the second portion 39 may be connected to each other on the cavity 6 between the fan-out substrate 2 and the die 10. The first portion 38 may laterally extend from the substrate electrode 4 of the fan-out substrate 2 toward the die 10. The second portion 39 may laterally extend from the pad electrode 12 of the die 10 toward the fan-out substrate 2. In some embodiments, the first portion 38 and the second portion 39 may have a first longitudinal axis 41a and a second longitudinal axis 41b, respectively, when viewed from a plan view. The first longitudinal axis 41a of the first portion 38 may be parallel to a first direction. The second longitudinal axis 418 of the second portion 39 may be parallel to a second direction different from the first direction. The first and second longitudinal axes 41a and 41b may intersect each other on the die 10. For example, the first longitudinal axis 41a and the second longitudinal axis 41b may intersect each other at a center of the die 10. An angle θ between the first and second longitudinal axes 41a and 41b may be equal to or less than twice the alignment tolerance (e.g., the rotation alignment tolerance). For example, the angle θ between the first and second longitudinal axes 41a and 41b may be about 0.2 degrees or less.

Referring again to FIGS. 1, 9A, and 9B, the first and second optical measurement apparatuses 100 and 100a may measure the interconnection lines 40 (S700). The first and second control parts 170 and 170a may obtain a two-dimensional (2D) image and a three-dimensional (3D) image of the interconnection lines 40. The first and second control parts 170 and 170a may calculate data of thicknesses, widths, and warpage of the interconnection lines 40 from the 2D image and the 3D image. The data of the thicknesses, the widths, and the warpage of the interconnection lines 40 may be applied to subsequent processes (feedback).

Referring to FIG. 1, the first to third control parts 170, 170a, and 260 may check whether the operation of forming the interconnection lines 40 is completed (S800). When the operation of forming the interconnection lines 40 is not completed, the operation S500 to the operation S800 may be performed again. The data of the thicknesses, the widths, and the warpage of the interconnection lines 40 may be used in the operation S620 of forming subsequent other interconnection lines. In some embodiments, even though not shown in the drawings, the interconnection lines 40 may be formed on a back surface of the mold substrate 14.

Figure 29A:
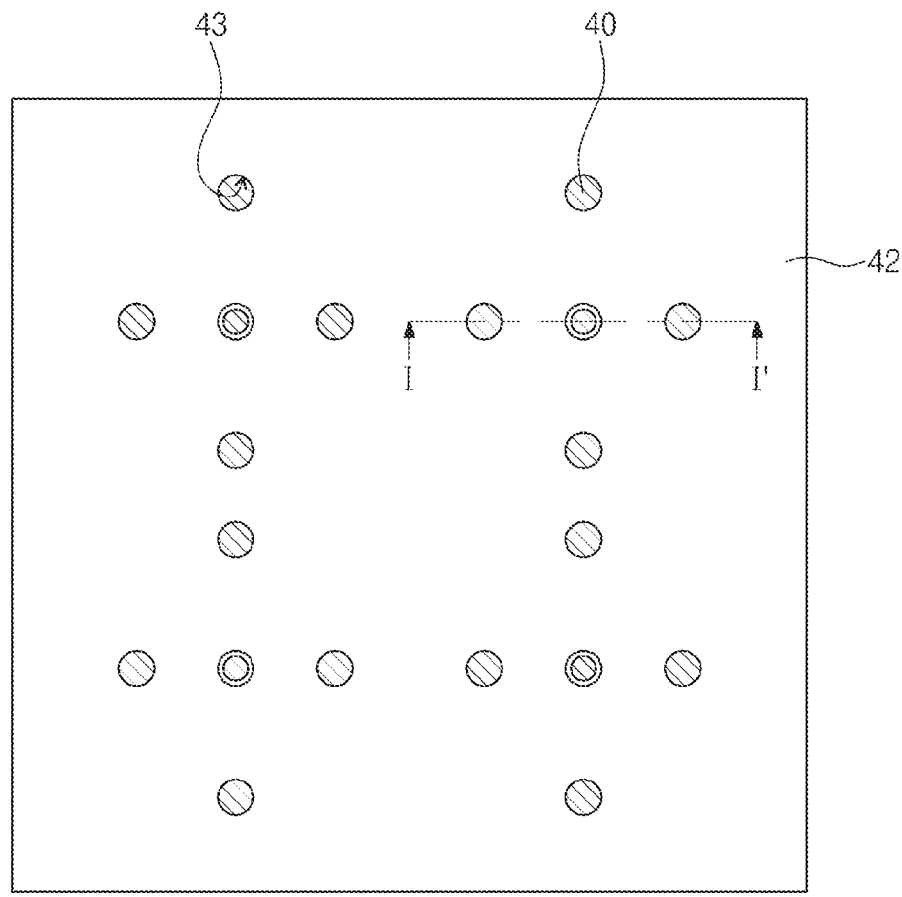
FIG. 29A is a plan view illustrating an embodiment of an operation of forming a passivation layer in FIG. 1.
Figure 29B:
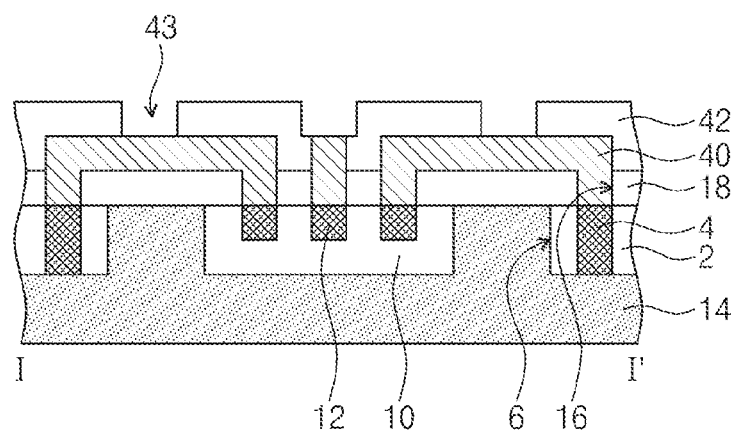
FIG. 29B is a cross-sectional view taken along a line I-I' of FIG. 29A.

FIG. 29A is a plan view illustrating an embodiment of the operation S900 of forming the passivation layer 42 in FIG. 1. FIG. 29B illustrates a cross-sectional view taken along a line I-I' of FIG. 29A.

Referring to FIGS. 1, 29A, and 29B, when the operation of forming the interconnection lines is completed, the passivation layer 42 may be formed on the interconnection lines 40 and the interlayer insulating layer 18 (S900). The passivation layer 42 may be formed by the same method as the interlayer insulating layer 18. For example, the passivation layer 42 may include a silicon oxide layer or a silicon nitride layer, which is formed by a CVD method. Alternatively, the passivation layer 42 may include silica or polymer, which is formed by a spin-coating method or a sol-gel method. Thereafter, the passivation layer 42 may be patterned to form second contact holes 4'. The second contact holes 43 may be formed by the same method as the first contact holes 16. The second contact holes 43 may expose portions of the interconnection lines 40.

Figure 30A:
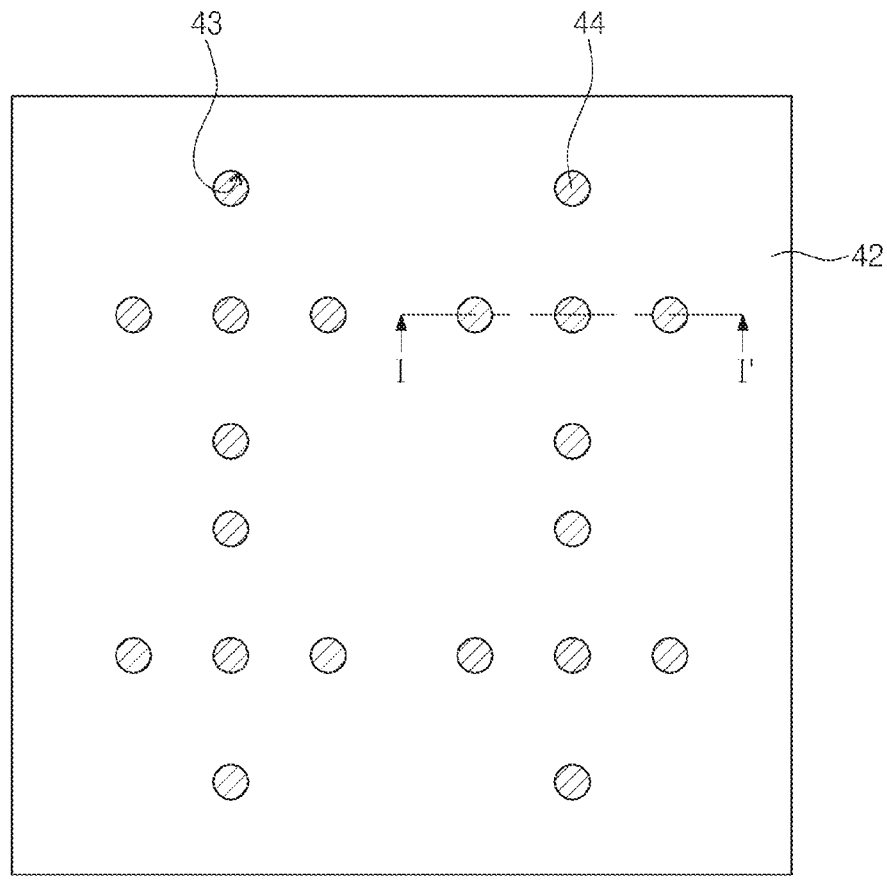
FIG. 30A is a plan view illustrating an embodiment of an operation of forming interconnection pads in FIG. 1.
Figure 30B:
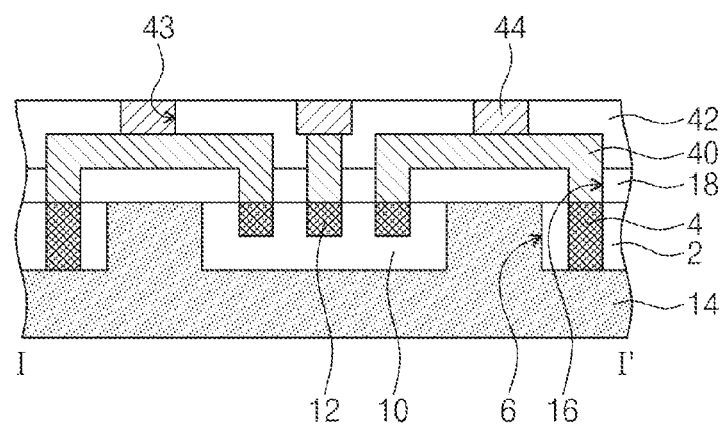
FIG. 30B is a cross-sectional view taken along a line I-I' of FIG. 30A.

FIG. 30A is a plan view illustrating an embodiment of the operation S1000 of forming the interconnection pads 44 in FIG. 1. FIG. 30B illustrates a cross-sectional view taken along a line I-I' of FIG. 30A.

Referring to FIGS. 1, 30A, and 30B, the interconnection pads 44 may be formed in the second contact holes 43, respectively (S1000). The interconnection pads 44 may be formed by a process of depositing a metal and a process of polishing the deposited metal. The interconnection pads 44 may be formed to have the substantially same height as the passivation layer 42.

Figure 31A:
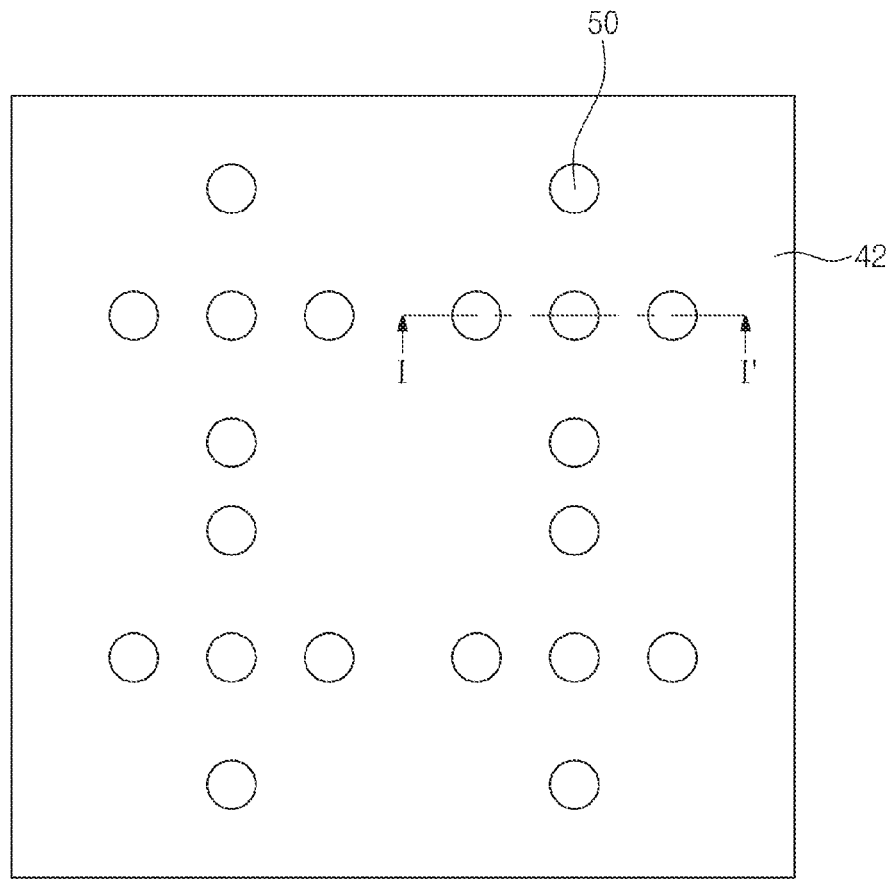
FIG. 31A is a plan view illustrating an embodiment of an operation of forming bumps in FIG. 1.
Figure 31B:
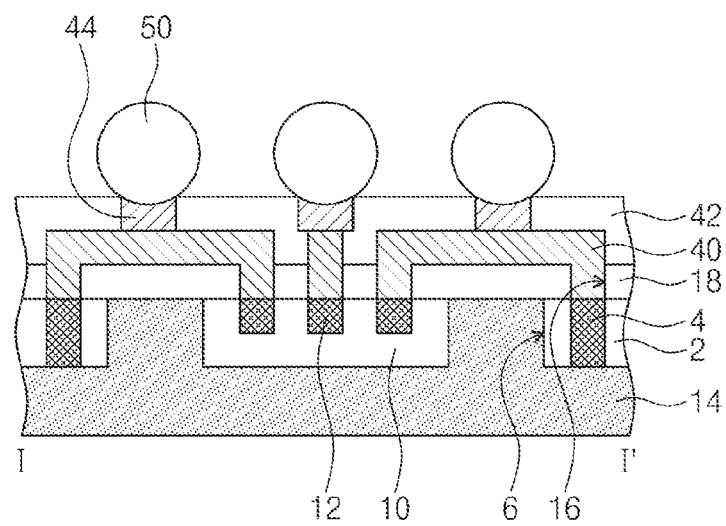
FIG. 31B is a cross-sectional view taken along a line I-I' of FIG. 31A.

FIG. 31A is a plan view illustrating an embodiment of the operation S1100 of forming the bumps 50 in FIG. 1. FIG. 31B illustrates a cross-sectional view taken along a line I-I' of FIG. 31A.

Referring to FIGS. 1, 31A, and 31B, the bumps 50 may be formed on the interconnection pads 44 (S1100). The bumps 50 may be provided onto the interconnection pads 44 by a bonding apparatus (not shown). For example, the number of the bumps 50 formed on one die 10 may range from several to hundreds.

Thereafter, the mold substrate 14 and the fan-out substrate 2 may be cut or sawed to separate the dies 10 from each other.

As described above, according to some embodiments of the inventive concepts, the method of fabricating the fan-out panel level package may include detecting the positions of the dies formed in the cavities of the fan-out substrate, and forming the interconnection lines of which at least one connects one die disposed at the position different from the pre-set position to the fan-out substrate. When a difference between the pre-set position and the detected position is the alignment tolerance, the interconnection lines may connect the die to the fan-out substrate. Thus, it is possible to minimize or prevent a defect of the interconnection lines which may be caused by misalignment of the fan-out substrate and the dies.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of fabricating a package, the method comprising:
    providing a mold substrate supporting dies in cavities of a fan-out substrate;
    obtaining an image of the fan-out substrate and the dies to detect positions of the dies with respect to the fan-out substrate in the image;
    forming interconnection lines, at least one of the interconnection lines includes,
        a first portion extending from the fan-out substrate to a target position on the cavity disposed between the fan-out substrate and one of the dies, the one of the dies disposed at the detected position different from the target position, and
        a second portion extending from the one of the dies to the fan-out substrate; and
    forming an interlayer insulating layer between the mold substrate and the interconnection lines,
    wherein the forming of the interconnection lines includes,
        forming first contact holes by removing portions of the interlayer insulating layer disposed on substrate electrodes of the fan-out substrate and pad electrodes of the dies disposed at the detected positions, and
        forming the interconnection lines by a patterning process, the interconnection lines connecting one or some of the substrate electrodes to one or some of the pad electrodes of the detected position,
    the forming of the interconnection lines by the patterning process includes,
        forming a metal layer on the interlayer insulating layer and in the first contact holes,
        forming a second photoresist layer on the metal layer,
        providing first ultraviolet light to a portion of the second photoresist layer disposed on the fan-out substrate and the cavity between the fan-out substrate and the one of the dies, to form a first interconnection exposure portion on the first portion, and providing second ultraviolet light different from the first ultraviolet light to a portion of the second photoresist layer disposed on the one of the dies and the cavity between the fan-out substrate and the one of the dies, thereby forming a second interconnection exposure portion on the second portion.

2. The method of claim 1, wherein
the forming of the first contact holes comprises:
forming a first photoresist layer on the interlayer insulating layer;
providing first ultraviolet light to the first photoresist layer disposed on the substrate electrodes; and
providing second ultraviolet light, different from the first ultraviolet light, to the first photoresist layer disposed on the pad electrodes.

3. The method of claim 2, wherein the forming of the first contact holes further comprises:
developing the first photoresist layer to remove portions of the first photoresist layer, which are disposed on the substrate electrodes and the pad electrodes, and
etching the interlayer insulating layer using the first photoresist layer as an etch mask to form the first contact holes exposing the substrate electrodes and the pad electrodes in the interlayer insulating layer.

4. The method of claim 1, wherein the forming of the interconnection lines by the patterning process further comprises:
developing the second photoresist layer to remove the second photoresist layer disposed around the substrate electrodes and the pad electrodes except portions of the second photoresist layer disposed between the substrate electrodes and the pad electrodes; and
forming the interconnection lines by removing the metal layer exposed by the portions of the second photoresist layer remaining after the developing.

5. The method of claim 1, further comprising:
checking whether the dies are normally disposed in an alignment tolerance of a pre-set positions, after the obtaining of the image of the fan-out substrate and the dies to detect the positions of the dies.

6. The method of claim 5, further comprising:
storing addresses of the dies when the dies are abnormally disposed; and
storing the detected positions of the dies when the dies are normally disposed.

7. The method of claim 1, wherein the providing of the mold substrate comprises:
forming the cavities in the fan-out substrate;
providing a dummy substrate to a bottom surface of the fan-out substrate; providing the dies onto the dummy substrate in the cavities;
forming the mold substrate on the dies, the dummy substrate, and the fan-out substrate; and
removing the dummy substrate.

8. The method of claim 1, further comprising:
forming a passivation layer having second contact holes exposing portions of the interconnection lines;
forming interconnection pads in the second contact holes; and forming bumps on the interconnection pads.

9. A method for forming interconnection lines for a package comprising:
detecting a position of a selected die;
determining if the selected die is disposed within an alignment tolerance of a target position;
forming first contact holes by removing portions of an interlayer insulating layer disposed on substrate electrodes of a fan-out substrate and pad electrodes of the selected die, if the selected die is disposed within the alignment tolerance; and
forming the interconnection lines by a patterning process, the interconnection lines connecting one or some of substrate electrodes to one or some of pad electrodes of the selected die,
wherein the forming first contact holes includes,
forming a first photoresist layer on the interlayer insulating layer,
exposing a first portion of the first photoresist layer disposed on the substrate electrodes and a second portion of the first photoresist layer disposed on the pad electrodes to first ultraviolet light and second ultraviolet light, respectively, the second ultraviolet light being different from the first ultraviolet light,
removing the first portion of the first photoresist layer and the second portion of the first photoresist layer by developing the first portion of the first photoresist layer and the second portion of the first photoresist layer; and
etching the interlayer insulating layer using the first photoresist layer as an etch mask to form the first contact holes exposing the substrate electrodes and the pad electrodes, and
wherein the forming the interconnection lines includes,
forming a metal layer on the interlayer insulating layer and in the first contact holes,
forming a second photoresist layer on the metal layer,
providing a third ultraviolet light and a fourth ultraviolet light to a first area of the photoresist layer to form a first interconnection exposure area and a second area of the photoresist layer to form the second interconnection exposure area, respectively, the first area of the second photoresist layer disposed on the fan-out substrate and a cavity between the fan-Out substrate and the selected die, the second area of the second photoresist layer disposed on the selected die and the cavity between the fan-out substrate and the selected die, the fourth ultraviolet light being different from the third ultraviolet light,
removing the second photoresist layer disposed around the substrate electrodes and the pad electrodes except the first interconnection exposure area and the second interconnection exposure area by developing the second photoresist layer, and
removing the metal layer exposed by the second photoresist layer after the developing.

10. The method of claim 9 wherein the alignment tolerance comprises:
about ±5 pm in a transverse direction;
about ±5 pm in a longitudinal direction; and about ±0.1 degree rotation.

11. The method of claim 9, further comprising:
storing addresses of the selected die when the selected die is abnormally disposed; and
storing the detected positions of the die when the selected die is normally disposed.

12. The method of claim 9, further comprising:
providing a mold substrate supporting dies in cavities of the fan-out substrate,
wherein the providing of the mold substrate comprises:
forming the cavities in the fan-out substrate;
providing a dummy substrate to a bottom surface of the fan-out substrate;
providing the dies onto the dummy substrate in the cavities;

forming the mold substrate on the dies, the dummy substrate, and the fan-out substrate; and removing the dummy substrate.

13. The method of claim 12, wherein the dies are memory chip or application processor chip.

14. The method of claim 9, wherein the fan-out substrate is Cu Clad Laminate substrate.

15. The method of claim 9, further comprising:

obtaining an image of the fan-out substrate and the selected die, wherein the selected die is detected in the image.

16. The method of claim 9, further comprising:

forming a passivation layer having second contact holes exposing portions of the interconnection lines;

forming interconnection pads in the second contact holes; and forming bumps on the interconnection pads.

* * * * *